US008808455B2

(12) United States Patent
Saito et al.

(10) Patent No.: US 8,808,455 B2
(45) Date of Patent: Aug. 19, 2014

(54) SUBSTRATE PROCESSING APPARATUS AND METHOD OF MANUFACTURING SEMICONDUCTOR DEVICE

(75) Inventors: Tatsuyuki Saito, Toyama (JP);
Masanori Sakai, Toyama (JP); Yukinao Kaga, Toyama (JP); Takashi Yokogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 546 days.

(21) Appl. No.: 13/014,419

(22) Filed: Jan. 26, 2011

(65) Prior Publication Data
US 2011/0186984 A1 Aug. 4, 2011

(30) Foreign Application Priority Data

Jan. 29, 2010 (JP) ................................. 2010-018908
Dec. 15, 2010 (JP) ................................. 2010-278995

(51) Int. Cl.
*C23C 16/455* (2006.01)
(Continued)

(52) U.S. Cl.
CPC ........ *C23C 16/455* (2013.01); *H01L 21/02186* (2013.01); *C23C 16/45578* (2013.01); *C23C 16/303* (2013.01); *C23C 16/301* (2013.01); *C23C 16/52* (2013.01); *H01L 23/482* (2013.01); *H01L 21/3205* (2013.01); *H01L 21/00* (2013.01)
USPC ............ 118/715; 118/724; 118/725; 118/696

(58) Field of Classification Search
CPC ............... C23C 16/301; C23C 16/303; C23C 16/45508; C23C 16/45514; C23C 16/45525; C23C 16/45527; C23C 16/45548; C23C 16/45557; C23C 16/45563; C23C 16/45574; C23C 16/45582; C23C 16/458; C23C 16/4582; C23C 16/45578; C23C 16/45546; C23C 16/45523; C23C 16/481; C23C 16/455; C23C 16/45583; C23C 16/46; C23C 16/52;
H01L 21/02186; H01L 21/67303; H01L 21/67309; H01L 21/67313; H01L 21/0228; H01L 21/3141; H01L 21/02337
USPC ................................. 118/724, 725, 715, 696
See application file for complete search history.

(56) References Cited

U.S. PATENT DOCUMENTS 6,435,865 B1 * 8/2002 Tseng et al. ................... 432/152
(Continued)

FOREIGN PATENT DOCUMENTS

JP  2008-303452  12/2008
(Continued)

*Primary Examiner* — Jeffrie R Lund
(74) *Attorney, Agent, or Firm* — Volpe and Koenig, P.C.

(57) ABSTRACT

Provided are a substrate processing apparatus and a method of manufacturing a semiconductor device which are able to form a conductive film, which is dense, includes a low concentration of source-derived impurities and has low resistivity, at a higher film-forming rate. The substrate processing apparatus includes a processing chamber configured to stack and accommodate a plurality of substrates; a first processing gas supply system configured to supply a first processing gas into the processing chamber; a second processing gas supply system configured to supply a second processing gas into the processing chamber; and a control unit configured to control the first processing gas supply system and the second processing gas supply system. Here, at least one of the first processing gas supply system and the second processing gas supply system includes two nozzles which are vertically arranged in a stacking direction of the substrates and have different shapes, and the control unit is configured to supply at least one of the first processing gas and the second processing gas into the processing chamber through the two nozzles having different shapes when films are formed on the substrates by supplying the first processing gas and the second processing gas into the processing chamber at pulses having different film-forming rates.

8 Claims, 11 Drawing Sheets

(51) Int. Cl.
*C23C 16/52* (2006.01)
*C23C 16/00* (2006.01)
*H01L 21/00* (2006.01)
*H01L 21/02* (2006.01)
*C23C 16/30* (2006.01)
*H01L 23/482* (2006.01)
*H01L 21/3205* (2006.01)

(56) References Cited

U.S. PATENT DOCUMENTS

| | | | |
|---|---|---|---|
| 7,622,007 B2* | 11/2009 | Nakaiso | 118/725 |
| 8,002,895 B2* | 8/2011 | Inoue et al. | 118/715 |
| 8,148,271 B2* | 4/2012 | Ueno et al. | 438/748 |
| 8,394,200 B2* | 3/2013 | Matsuura et al. | 118/715 |
| 8,691,708 B2* | 4/2014 | Kaga et al. | 438/761 |
| 2004/0094091 A1* | 5/2004 | Yang et al. | 118/715 |
| 2005/0164466 A1* | 7/2005 | Zheng et al. | 438/398 |
| 2006/0110533 A1* | 5/2006 | Hwang et al. | 427/248.1 |
| 2006/0128127 A1 | 6/2006 | Seo et al. | |
| 2007/0034158 A1* | 2/2007 | Nakaiso | 118/725 |
| 2007/0157882 A1* | 7/2007 | Ozaki et al. | 118/715 |
| 2008/0075838 A1* | 3/2008 | Inoue et al. | 427/58 |
| 2008/0145533 A1* | 6/2008 | Honda et al. | 427/248.1 |
| 2009/0078201 A1* | 3/2009 | Matsuura et al. | 118/723 E |
| 2009/0130331 A1 | 5/2009 | Asai et al. | |
| 2009/0130829 A1* | 5/2009 | Noda et al. | 438/503 |
| 2009/0197424 A1* | 8/2009 | Sakai et al. | 438/758 |
| 2009/0223448 A1* | 9/2009 | Sakai et al. | 118/715 |
| 2009/0291566 A1* | 11/2009 | Ueno et al. | 438/758 |
| 2010/0081288 A1* | 4/2010 | Nakaiso | 438/758 |
| 2011/0031593 A1* | 2/2011 | Saito et al. | 257/632 |
| 2011/0130011 A1* | 6/2011 | Sasajima et al. | 438/770 |
| 2011/0163416 A1* | 7/2011 | Zheng et al. | 257/532 |
| 2011/0183519 A1* | 7/2011 | Kaga et al. | 438/680 |
| 2011/0186984 A1* | 8/2011 | Saito et al. | 257/734 |
| 2011/0229638 A1* | 9/2011 | Qin | 427/255.28 |
| 2012/0156886 A1* | 6/2012 | Shirako et al. | 438/706 |
| 2012/0280369 A1* | 11/2012 | Saito et al. | 257/629 |
| 2013/0166057 A1* | 6/2013 | Zheng et al. | 700/121 |
| 2014/0080317 A1* | 3/2014 | Kaga et al. | 438/775 |

FOREIGN PATENT DOCUMENTS

| | | |
|---|---|---|
| KR | 100596495 B1 | 7/2006 |
| WO | 2007/020874 A1 | 2/2007 |

* cited by examiner

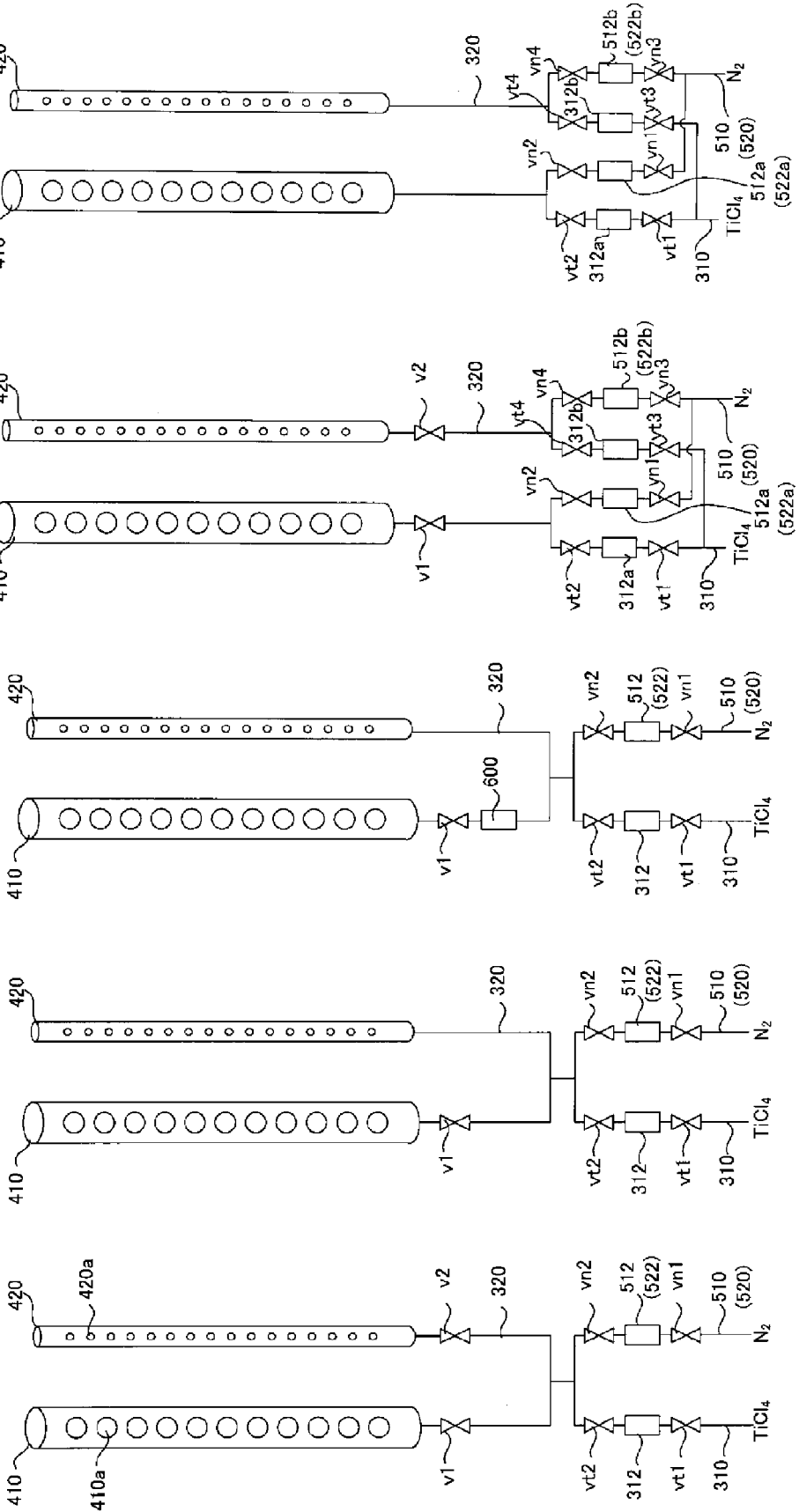

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. 119 of Japanese Patent Application No. 2010-018908 filed on Jan. 29, 2010 and Japanese Patent Application No. 2010-278995 filed on Dec. 15, 2010, the entire contents of which are hereby incorporated by reference.

FIELD OF THE INVENTION

The present invention relates to a substrate processing apparatus and a method of manufacturing a semiconductor device, and more particularly, to a substrate processing apparatus which forms a metal film or a metal compound on a substrate (a wafer) using a halogenated metal compound or an organometallic compound as a source, and a method of manufacturing a semiconductor device.

DESCRIPTION OF THE RELATED ART

Methods of forming a predetermined film on a substrate include a chemical vapor deposition (CVD) method. The CVD method is a method of forming a film including elements included in source molecules as components on a substrate through a reaction of at least two sources in a vapor phase or on a surface of the substrate. Also, the methods of forming a predetermined film on a substrate include an atomic layer deposition (ALD) method. The ALD method is a method of forming a film which is controlled at an atomic layer level using a surface reaction by alternatively supplying at least two sources used to form a film one by one onto a substrate under certain film-forming conditions (temperature, time, etc), and adsorbing the sources in a unit of an atomic layer. In the ALD method, the substrate may be processed at a substrate temperature (processing temperature) lower than the CVD method, and a thickness of a film to be formed may be controlled by the number of film-forming cycles.

Also, a titanium nitride (TiN) film as disclosed in Patent Document 1 may be, for example, used as a conductive film formed on the substrate. In addition, tantalum (Ta), aluminum (Al), tungsten (W), manganese (Mn) and nitrides thereof, oxides of Mn and Zn, titanium (Ti), etc. may be used as the conductive film. Also, oxides and nitrides of hafnium (Hf), zirconium (Zr), Al, etc. may be, for example, used as an insulating film.

PRIOR-ART DOCUMENT

Patent Document

[Patent Document 1] International Publication No. 2007/020874

When a TiN film is formed on a substrate to be processed as a conductive film, titanium tetrachloride ($TiCl_4$) may be, for example, used as a Ti-containing source, and ammonia ($NH_3$) may be used as a nitride gas. However, when a film is formed using a CVD method, chlorine (Cl) tends to be easily absorbed into the film, compared to when a film is formed using an ALD method, resulting in an increase in resistivity, etc.

Also, a continuous film of TiN films formed by the ALD method may have a smooth surface, compared to the films formed by the CVD method, thereby obtaining a TiN film having a relatively low resistance value.

Also, good step coverage can be obtained. On the other hand, since a film-forming rate is slow, compared to when using the CVD method, it takes longer to obtain a film having a desired thickness, and a thermal budget of a substrate may be increased. Also, productivity may be low due to the slow film-forming rate.

SUMMARY OF THE INVENTION

Therefore, a main object of the present invention aims to solve the above problems, and provide a substrate processing apparatus and a method of manufacturing a semiconductor device which are able to form a conductive film that is dense, includes a low concentration of source-derived impurities and has low resistivity, at a higher film-forming rate.

In order to solve the above problems, according to one embodiment of the present invention, there is provided a substrate processing apparatus including: a processing chamber configured to stack and accommodate a plurality of substrates; a first processing gas supply system configured to supply a first processing gas into the processing chamber; a second processing gas supply system configured to supply a second processing gas into the processing chamber; and a control unit configured to control the first processing gas supply system and the second processing gas supply system, wherein at least one of the first processing gas supply system and the second processing gas supply system includes two nozzles which are vertically arranged in a stacking direction of the substrates and have different shapes, and the control unit controls the first processing gas supply system and the second processing gas supply system to supply at least one of the first processing gas and the second processing gas into the processing chamber through the two nozzles having the different shapes.

According to another embodiment of the present invention, there is provided a substrate processing apparatus including: a processing chamber configured to stack and accommodate a plurality of substrates; a first processing gas supply system configured to supply a first processing gas into the processing chamber; a second processing gas supply system configured to supply a second processing gas into the processing chamber; and a control unit configured to control the first processing gas supply system and the second processing gas supply system, wherein the first processing gas supply system and the second processing gas supply system include two nozzles which are vertically arranged in a stacking direction of the substrates and have different shapes, respectively, and the control unit is configured to supply the first processing gas and the second processing gas through the two nozzles having different shapes, respectively, when films are formed on the substrates by supplying the first processing gas and the second processing gas into the processing chamber at pulses having different film-forming rates.

According to still another embodiment of the present invention, there is provided a method of manufacturing a semiconductor device, including the steps of: (a) supplying a first processing gas into a processing chamber, in which a substrate is accommodated, through a first nozzle and simultaneously supplying a second processing gas into the processing chamber through a second nozzle; (b) exhausting the processing chamber; (c) supplying the first processing gas into the processing chamber through a third nozzle having a different shape from the first nozzle and simultaneously supplying the second processing gas into the processing chamber through the second nozzle; and (d) exhausting the processing chamber, wherein steps (a) through (d) are sequentially performed once or more to form a desired film on the substrate.

According to the present invention, a TiN film that is higher in quality than a TiN film formed by a conventional CVD method can be obtained at a higher film-forming rate, that is, with a higher productivity than a TiN film formed by an ALD method.

BRIEF DESCRIPTION OF THE DRAWINGS

FIGS. 11a-11e are diagrams exemplifying variations of a method of supplying a first processing gas (TiCl4) through a first nozzle and a second nozzle used in one embodiment of the present invention.

DETAILED DESCRIPTION OF THE PREFERRED EMBODIMENTS

Hereinafter, preferred embodiments of the present invention will be described with reference to the accompanying drawings. A substrate processing apparatus according to this embodiment is configured as one example of a semiconductor manufacturing apparatus used to manufacture semiconductor devices (integrated circuits (ICs)).

In the following description, a case where a vertical apparatus in which a film-forming process is performed on a substrate is used as one example of the substrate processing apparatus will be described. However, the present invention is not limited to use of the vertical apparatus, but, for example, a single-type apparatus may be used herein.

<Overall Configuration of Apparatus>

Figure 1:
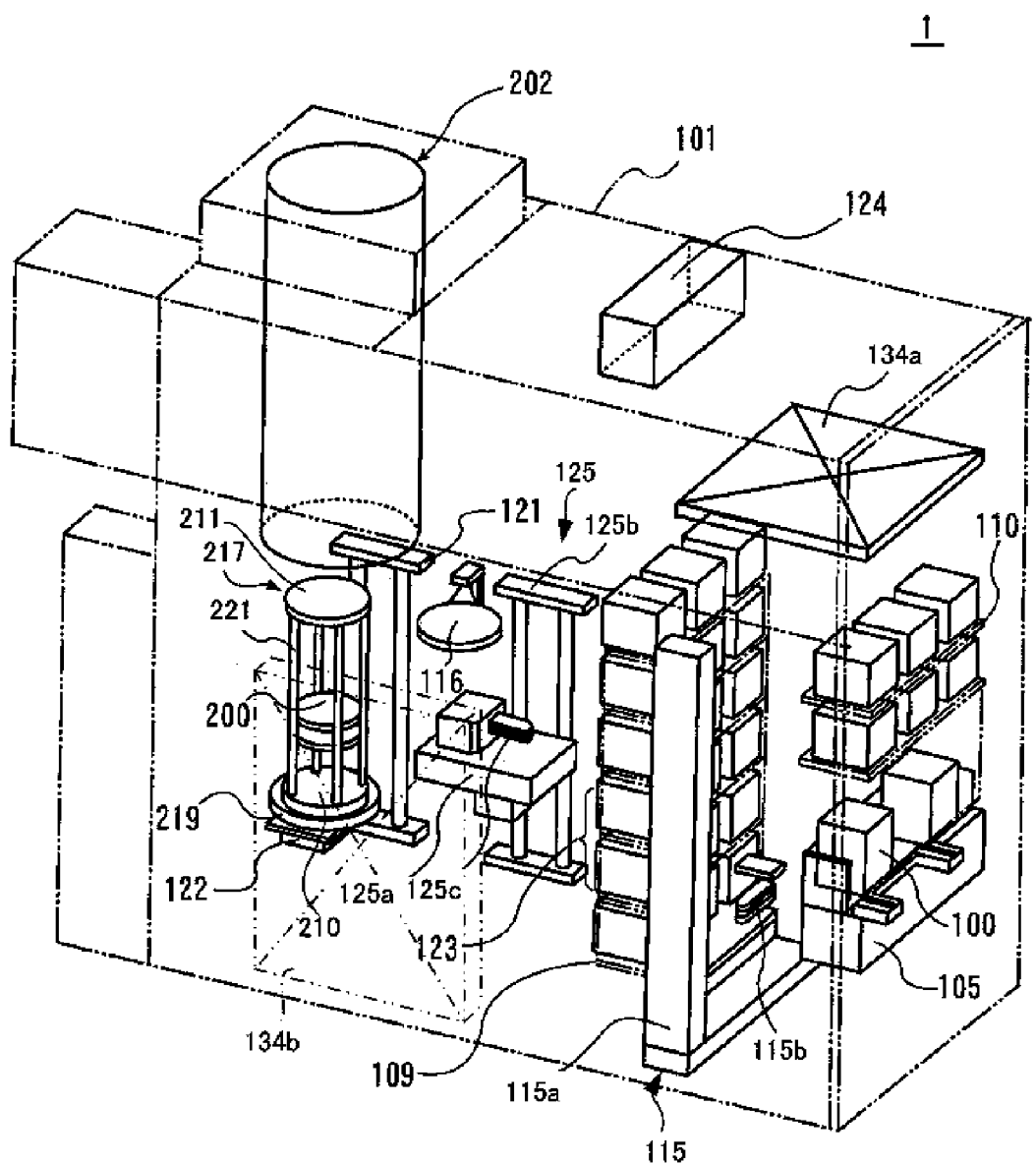
FIG. 1 is an oblique perspective view schematically illustrating a configuration of a substrate processing apparatus preferably used in one embodiment of the present invention.

As shown in FIG. 1, a cassette 100 for accommodating a wafer 200 that is one example of a substrate is used in a substrate processing apparatus 1, and the wafer 200 is made of a material such as silicon. The substrate processing apparatus 1 includes a housing 101, and a cassette stage 105 is installed inside the housing 101. The cassette 100 is loaded onto the cassette stage 105 or unloaded from the cassette stage 105 using an in-process conveying device (not shown).

The cassette stage 105 is placed such that a wafer inlet/outlet port of the cassette 100 can be directed upward while the wafer 200 in the cassette 100 is held in a vertical posture by the in-process conveying device. The cassette stage 105 is configured so that the cassette 100 is rotated 90° clockwise in a longitudinal direction to the back of the housing 101 and thus the wafer 200 in the cassette 100 can be in a horizontal posture, and the wafer inlet/outlet port of the cassette 100 can be directed to the back of the housing 101.

A cassette shelf 109 is installed at approximately a middle portion in front and rear directions in the housing 101, and the cassette shelf 109 is configured to store a plurality of cassettes 100 in a plurality of columns and a plurality of rows. A transfer shelf 123 in which the cassette 100 to be conveyed by a wafer transfer mechanism 125 is accommodated is installed in the cassette shelf 109.

A preliminary cassette shelf 110 is installed above the cassette stage 105, and is configured to store the cassette 100 in reserve.

A cassette conveying device 115 is installed between the cassette stage 105 and the cassette shelf 109. The cassette conveying device 115 includes a cassette elevator 115a capable of moving up and down while holding the cassette 100, and a cassette conveying mechanism 115b serving as a conveying mechanism. The cassette conveying device 115 is configured to convey the cassette 100 among the cassette stage 105, the cassette shelf 109, and the preliminary cassette shelf 110 by a continuous operation of the cassette elevator 115a and the cassette conveying mechanism 115b.

The wafer transfer mechanism 125 is installed in the rear of the cassette shelf 109. The wafer transfer mechanism 125 includes a wafer transfer device 125a capable of rotating in a horizontal direction or linearly moving the wafer 200, and a wafer transfer device elevator 125b for moving up and down the wafer transfer device 125a. Tweezers 125c for picking up the wafer 200 are installed in the wafer transfer device 125a. By using the tweezers 125c as a means for placing the wafer 200, the wafer transfer mechanism 125 is configured to load (charge) the wafer 200 into a boat 217 or unload (discharge) the wafer 200 from the boat 217 by a continuous operation of the wafer transfer device 125a and the wafer transfer device elevator 125b.

A processing furnace 202 for thermally processing the wafer 200 is installed above the rear of the housing 101, and a lower end of the processing furnace 202 is configured to be opened and closed by means of a furnace opening shutter 116.

A boat elevator 121 for moving up and down the boat 217 with respect to the processing furnace 202 is installed below the processing furnace 202. An arm 122 is connected to an elevating platform of the boat elevator 121, and a seal cap 219 is horizontally installed in the arm 122. The seal cap 219 is configured to be able to vertically support the boat 217 and close the lower end of the processing furnace 202.

The boat 217 includes a plurality of holding members, and is configured to horizontally hold a plurality of (for example, approximately 50 to 150) wafers 200 in a state where the wafers 200 are aligned in a vertical direction with centers thereof being aligned with one another.

A cleaning unit 134a for supplying clean air having a cleaned atmosphere is installed above the cassette shelf 109. The cleaning unit 134a includes a supply fan and a dust-proof filter, and is configured to allow the clean air to flow inside the housing 101.

A cleaning unit 134b for supplying clean air is installed in a left side end of the housing 101. Also, the cleaning unit 134b includes a supply fan and a dust-proof filter, and is configured to allow the clean air to flow around the wafer transfer device 125a or the boat 217. The clean air is exhausted out of the housing 101 after the clean air flows around the wafer transfer device 125a and the boat 217.

<Operation of Processing Apparatus>

Next, a main operation of the substrate processing apparatus 1 will be described.

When the cassette 100 is loaded onto the cassette stage 105 by means of the in-process conveying device (not shown), the cassette 100 is placed such that the wafer 200 is held on the cassette stage 105 in a vertical posture and a wafer inlet/outlet port of the cassette 100 is directed upward. Then, the cassette 100 is rotated 90° clockwise in a longitudinal direction to the back of the housing 101 such that the wafer 200 in the cassette 100 can be in a horizontal posture, and the wafer inlet/outlet port of the cassette 100 can be directed to the back of the housing 101 by the cassette stage 105.

Then, the cassette 100 is automatically conveyed and placed to a preset shelf position of the cassette shelf 109 or the preliminary cassette shelf 110 by means of the cassette conveying device 115, and temporarily stored. Then, the cassette 100 is transferred from the cassette shelf 100 or the preliminary cassette shelf 110 into the transfer shelf 123 by means of the cassette conveying device 115, or directly conveyed into the transfer shelf 123.

When the cassette 100 is transferred to the transfer shelf 123, the wafer 200 is picked up from the cassette 100 through the wafer inlet/outlet port by means of the tweezers 125c of the wafer transfer device 125a, and loaded (charged) into the boat 217. The wafer transfer device 125a placing the wafer 200 into the boat 217 returns to the cassette 100, and charges another wafer 200 into the boat 217.

When a preset number of wafers 200 are charged into the boat 217, the furnace opening shutter 116 covering the lower end of the processing furnace 202 is opened, and the lower end of the processing furnace 202 is then opened. Then, the boat 217 holding a group of the wafers 200 is loaded into the processing furnace 202 by a raising operation of the boat elevator 121, and a lower portion of the processing furnace 202 is closed by the seal cap 219.

After the loading process, the wafers 200 are optionally processed in the processing furnace 202. After the optional processing, the wafers 200 and the cassette 100 are unloaded from the housing 101 in reverse order of that described above.

<Configuration of Processing Furnace>

Next, the processing furnace 202 applied to the above-described substrate processing apparatus will be described with reference to FIGS. 2 through 4.

Figure 2:
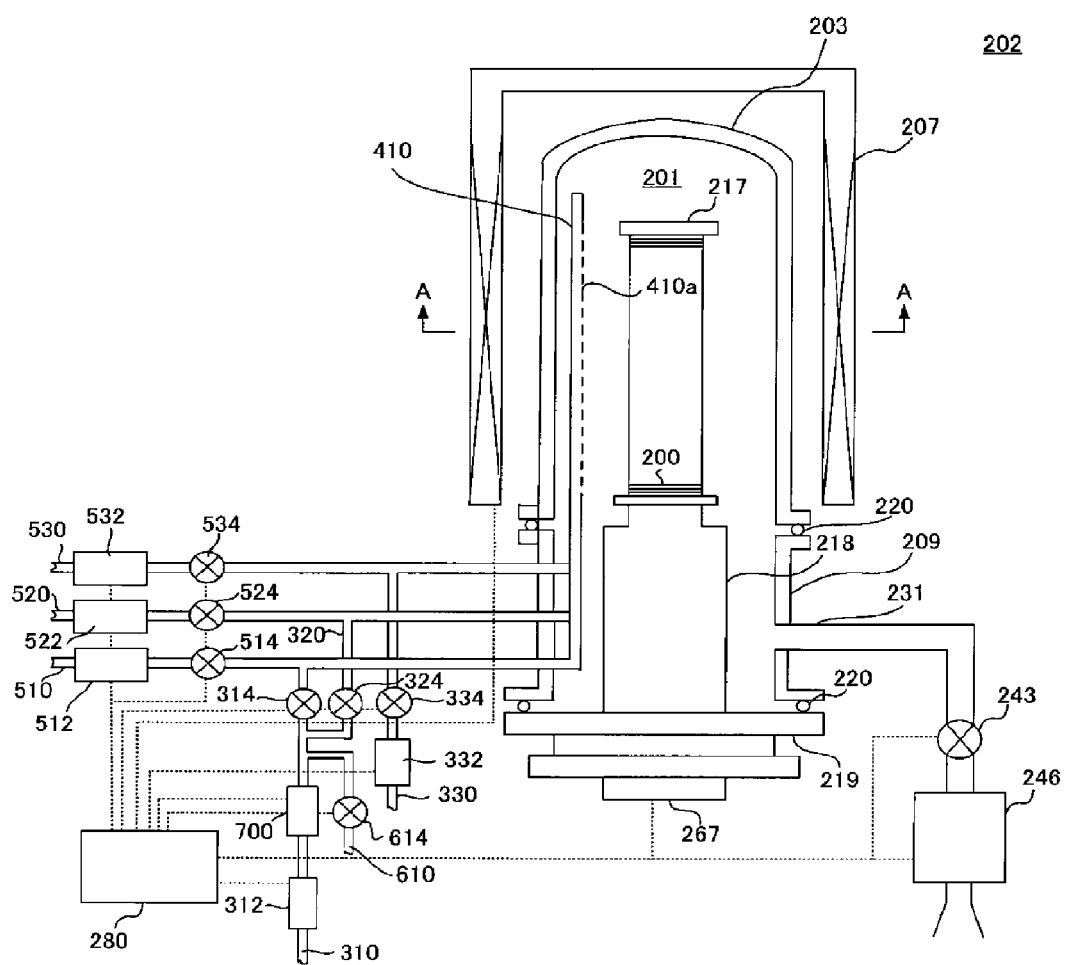
FIG. 2 is a configuration diagram schematically exemplifying a processing furnace and its accompanying members preferably used in one embodiment of the present invention, particularly a longitudinal cross-sectional view illustrating a part of the processing furnace.
Figure 3:
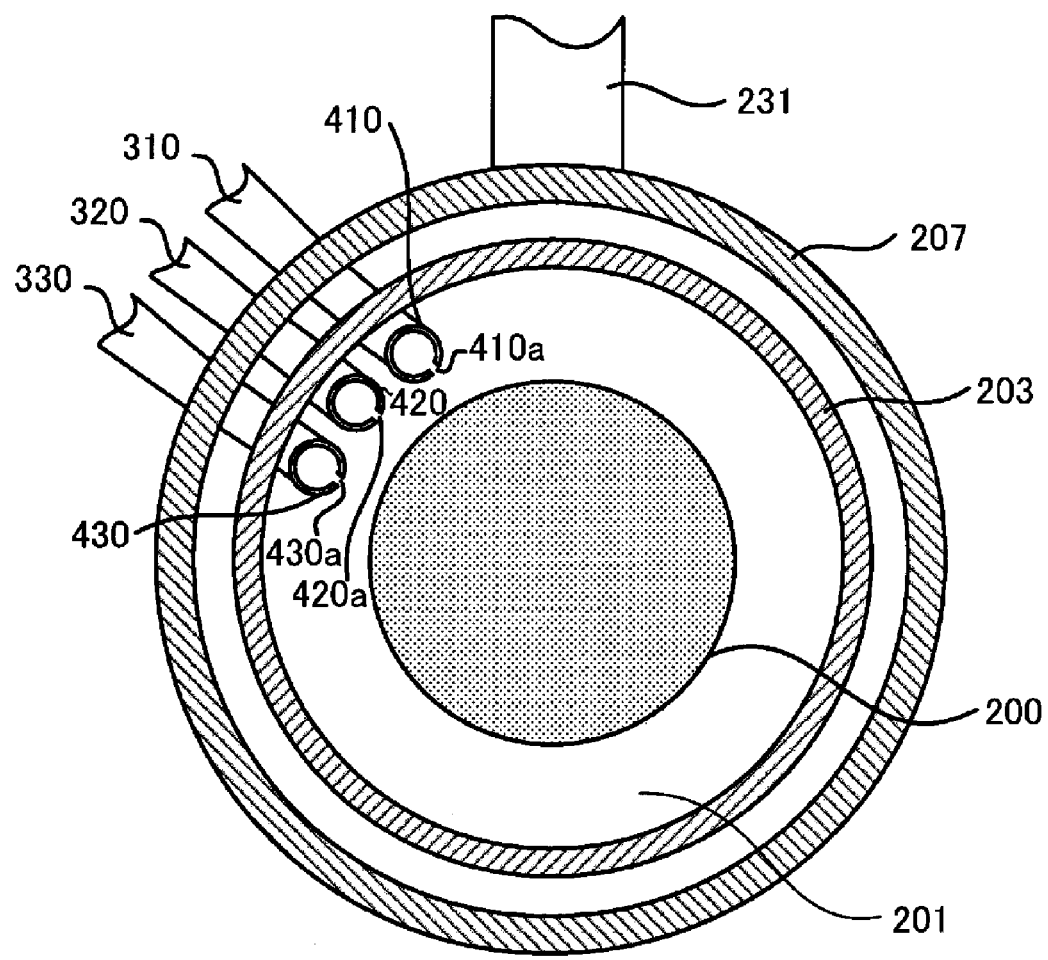
FIG. 3 is a cross-sectional view taken along line A-A in the processing furnace shown in FIG. 2, which is preferably used in one embodiment of the present invention.
Figure 4:
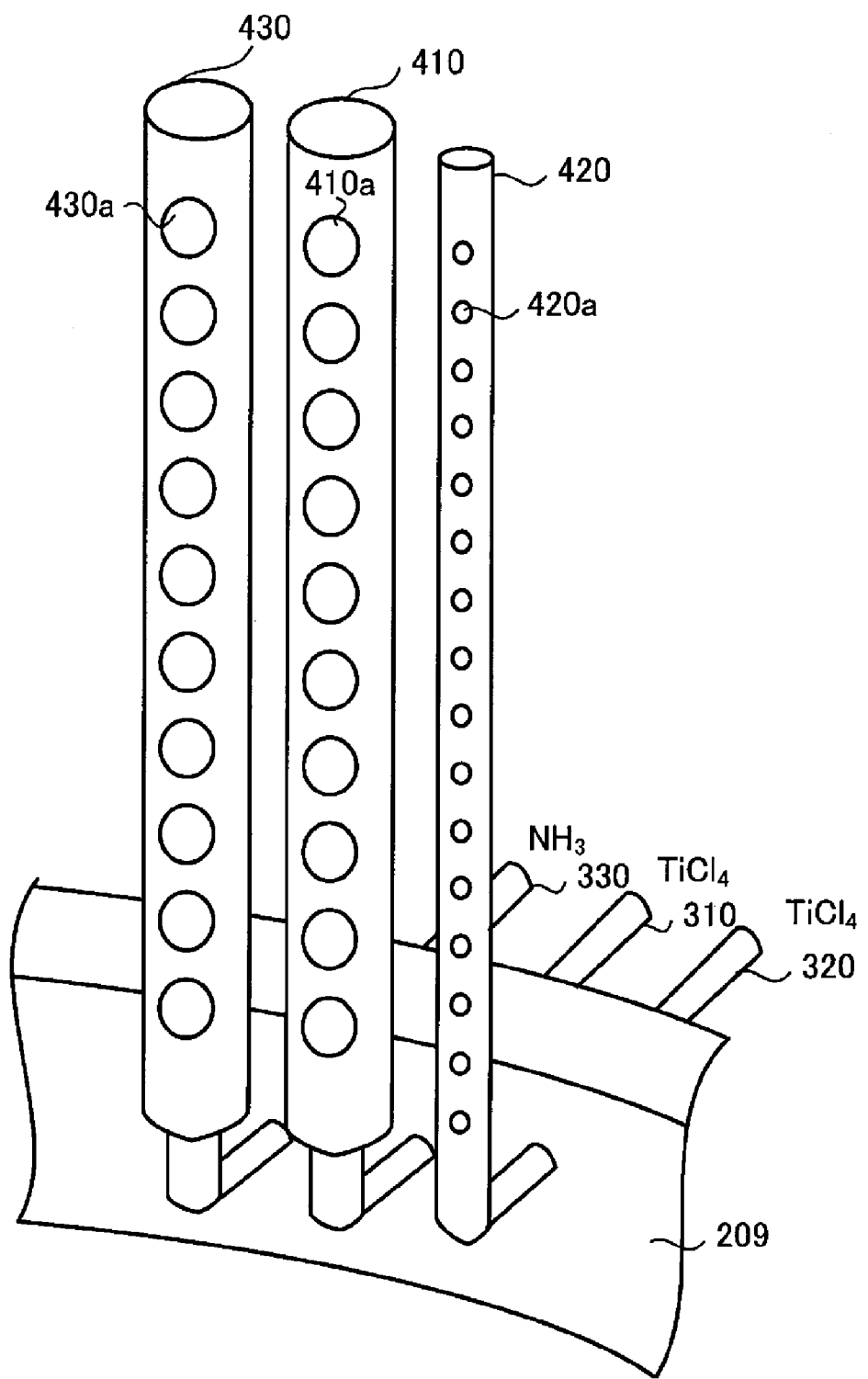
FIG. 4 is a configuration diagram schematically illustrating nozzles preferably used in one embodiment of the present invention.

As shown in FIGS. 2 and 3, a heater 207 that is a heating device (a heating means) for heating the wafer 200 is installed in the processing furnace 202. The heater 207 includes a heat insulating member having a cylindrical shape with its upper portion closed, and a plurality of heater wires, and has a unit configuration in which the heater wires are installed with respect to the heat insulating member. A reaction tube 203 made of quartz to process the wafer 200 is installed inside the heater 207.

A manifold 209 made of stainless steel is installed in a lower end of the reaction tube 203 via an O-ring 220 serving as a sealing member. An opening in a lower end of the manifold 209 is hermetically closed via the O-ring 220 by the seal cap 219 serving as a lid. In the processing furnace 202, a processing chamber 201 is formed by at least the reaction tube 203, the manifold 209 and the seal cap 219.

A boat support 218 for supporting the boat 217 is installed in the seal cap 219. As shown in FIG. 1, the boat 217 includes a bottom plate 210 fixed to the boat support 218 and a top plate 211 arranged above the bottom plate 210, and has a configuration in which a plurality of posts 221 are installed between the bottom plate 210 and the top plate 211. The plurality of wafers 200 are held by the boat 217. The plurality of wafers 200 are supported by the posts 221 of the boat 217 in a state of holding a horizontal posture at regular intervals from each other.

In the above-described processing furnace 202, the boat 217 is inserted into the processing chamber 201 while being supported by the boat support 218 with the plurality of wafers 200 to be batch-processed being stacked in multiple stages on the boat 217, and the heater 207 is configured to heat the wafer 200 inserted into the processing chamber 201 at a predetermined temperature.

As shown in FIGS. 2 and 3, three gas supply tubes 310, 320 and 330 (a first gas supply tube 310, a second gas supply tube 320 and a third gas supply tube 330) for supplying a first processing gas and a second processing gas are connected to the processing chamber 201.

[First Processing Gas Supply System]

A mass flow controller 312 serving as a mass flow control device (a mass flow control means), an vaporizer 700 serving as an vaporization unit (an vaporization means) and a valve 314 serving as a switching valve are installed in the first gas supply tube 310 in order from an upstream side. A nozzle 410 (a first nozzle 410) is connected to a front end of the first gas supply tube 310. The first nozzle 410 extends from an arc-shaped space, which is formed between the wafer 200 and an inner wall of the reaction tube 203 constituting the processing chamber 201, in a vertical direction (a stacking direction of the wafers 200) along the inner wall of the reaction tube 203. As shown in FIG. 4, a plurality of first gas supply holes 410a for supplying the first processing gas are installed in a side surface of the first nozzle 410. The first gas supply holes 410a have opening areas that are equal or gradually changed in size from the bottom to the top thereof, and are installed at the same opening pitch.

Also, a vent line 610 and a valve 614 connected to an exhaust pipe 231 to be described later are installed between the vaporizer 700 and the valve 314 in the first gas supply tube 310. When the first processing gas is not supplied into the processing chamber 201, the first processing gas is supplied into the vent line 610 via the valve 614.

Also, a carrier gas supply tube 510 for supplying a carrier gas is connected to the first gas supply tube 310. A mass flow controller 512 and a valve 514 are installed in the carrier gas supply tube 510.

Also, a second gas supply tube 320 arranged between a connection unit of the vent line 610 and the valve 314 is connected to the first gas supply tube 310. A valve 324 serving as a switching valve is installed in the second gas supply tube 320. A nozzle 420 (a second nozzle) is connected to a front end of the second gas supply tube 320. The second nozzle 420 also extends from an arc-shaped space, which is formed between the wafer 200 and an inner wall of the reaction tube 203 constituting the processing chamber 201, in a vertical direction (a stacking direction of the wafers 200) along the inner wall of the reaction tube 203. As shown in FIG. 4, a plurality of second gas supply holes 420a for supplying the first processing gas are installed in a side surface of the second nozzle 420. The second gas supply holes 420a have opening areas that are equal or gradually changed in size from the bottom to the top thereof, and are installed at the same opening pitch.

The first gas supply holes 410a of the first nozzle 410 and the second gas supply holes 420a of the second nozzle 420 have different opening areas (hole diameters). For example, the second gas supply holes 420a of the second nozzle 420 are opened at a smaller opening area than the first gas supply holes 410a of the first nozzle 410.

Also, a carrier gas supply tube 520 for supplying a carrier gas is connected to the second gas supply tube 320. A mass flow controller 522 and a valve 524 are installed in the carrier gas supply tube 520.

[Second Processing Gas Supply System]

A mass flow controller 332 serving as a mass flow control device (a mass flow control means) and a valve 334 are installed in the third gas supply tube 330 in order from an upstream side. A nozzle 430 (a third nozzle 430) is connected to a front end of the third gas supply tube 330. Similar to the first nozzle 410, the third nozzle 430 also extends from an arc-shaped space, which is formed between the wafer 200 and an inner wall of the reaction tube 203 constituting the processing chamber 201, in a vertical direction (a stacking direction of the wafers 200) along the inner wall of the reaction tube 203. As shown in FIG. 4, a plurality of third gas supply holes 430a for supplying the second processing gas are installed in a side surface of the third nozzle 430. Also, the third gas supply holes 430a have opening areas that are equal or gradually changed in size from the bottom to the top thereof, and are installed at the same opening pitch.

A carrier gas supply tube 530 for supplying a carrier gas is connected to the third gas supply tube 330. A mass flow controller 532 and a valve 534 are installed in the carrier gas supply tube 530.

For example, when a source supplied through the first gas supply tube 310 is in a liquid state, a first processing gas is supplied into the processing chamber 201 from the first gas supply tube 310 further via the first nozzle 410 after joining with the carrier gas supply tube 510 via the mass flow controller 312, the vaporizer 700 and the valve 314. Also, the first processing gas may be supplied only through the first gas supply tube 310, be supplied only through the second gas supply tube 320, or be supplied through both the first gas supply tube 310 and the second gas supply tube 320 under the control of the valve 314 and the valve 324. In addition, when a source supplied through the first gas supply tube 310 is, for example, in a gaseous state, the mass flow controller 312 is exchanged with a gas mass flow controller, and thus the use of the vaporizer 700 is not necessary. Also, a second processing gas is supplied into the processing chamber 201 from the third gas supply tube 330 via the third nozzle 430 after joining with the carrier gas supply tube 530 via the mass flow controller 332 and the valve 334.

As one example of the configuration, a Ti-containing source such as titanium tetrachloride (TiCl$_4$), tetrakisdimethylaminotitanium (TDMAT, Ti[N(CH$_3$)$_2$]$_4$) or tetrakisdiethylaminotitanium (TDEAT, Ti[N(CH$_2$CH$_3$)$_2$]$_4$)) is introduced as one example of the first processing gas into the first gas supply tube 310. As one example of the second processing gas serving as a reforming gas for reforming the first processing gas, a nitride source such as ammonia (NH$_3$), nitrogen (N$_2$), nitrous oxide (N$_2$O) or monomethylhydrazine (CH$_6$N$_2$), or hydrogen (H$_2$) is introduced into the third gas supply tube 330.

[Exhaust System]

An exhaust pipe 231 for exhausting the inside of the processing chamber 201 via a valve 243 is connected to the processing chamber 201. A vacuum pump 246 serving as an exhaust device (an exhaust means) is connected to the exhaust pipe 231, and is configured to be able to vacuum-exhaust the inside of the processing chamber 201 by operation of the vacuum pump 246. The valve 243 is a switching valve that can start and stop the vacuum-exhaust of the processing chamber 201 by means of a switching operation, and control an opening angle of the valve to adjust an inner pressure of the processing chamber 201 as well.

A boat 217 is installed in a central region in the reaction tube 203. The boat 217 is configured to be able to move up and down (go in and out) with respect to the reaction tube 203 by means of the boat elevator 121. A boat rotation mechanism 267 for rotating the boat 217 to improve processing uniformity is installed in a lower end of the boat support 218 configured to support the boat 217. The boat 217 supported by the boat support 218 may be rotated by driving the boat rotation mechanism 267.

Each of the above-described members such as the mass flow controllers 312, 332, 512, 522 and 532, the valves 314, 324, 334, 514, 524, 534, 243 and 614, the heater 207, the vacuum pump 246, the boat rotation mechanism 267 and the boat elevator 121 is connected to a controller 280. The controller 280 is one example of a control unit (a control means) for controlling the whole operation of the substrate processing apparatus 1, and is configured to control adjustment of a flow rate of the mass flow controllers 312, 332, 512, 522 and 532, a switching operation of the valves 314, 324, 334, 514, 524, 534 and 614, switching and pressure-adjustment operations of the valve 243, adjustment of a temperature of the heater 207, start and stop of the vacuum pump 246, adjustment of a rotary speed of the boat rotation mechanism 267, a raising/lowering operation of the boat elevator 121, etc.

<Method of Manufacturing Semiconductor Device>

Next, examples of a method of forming an insulation film on a substrate using the processing furnace 202 of the above-described substrate processing apparatus when large scale integration (LSI) is manufactured as one process of the method of manufacturing a semiconductor device will be described. Also, in the following description, operations of each of the parts constituting the substrate processing apparatus are controlled by the controller 280.

First Embodiment

In this embodiment, a method of forming a TiN film as a conductive film on a substrate will be described. The TiN films are formed on the substrates through the first nozzle 410 and the second nozzle 420, which have different hole diameters, through two processes using a CVD method. First, as a first film-forming process, a TiN film is formed on the substrate by supplying a Ti-containing source through the gas supply hole 410a (the first nozzle 410) (step 1). Next, as a second film-forming process, a TiN film is formed on the substrate by supplying a Ti-containing source through the gas supply hole 420a (the second nozzle 420) having a smaller hole diameter than the gas supply hole 410a, which is achieved by supplying a sufficient supply amount of a nitride gas while relatively reducing a flow rate of the Ti-containing source compared to that of the nitride gas (step 2). A TiN layer is formed on the substrate by performing the first film-forming process and the second film-forming process at least once in the same processing chamber 201. In this embodiment, a case where TiCl$_4$ and NH$_3$ are used as the Ti-containing source and the nitride gas, respectively, will be described.

Figure 5:
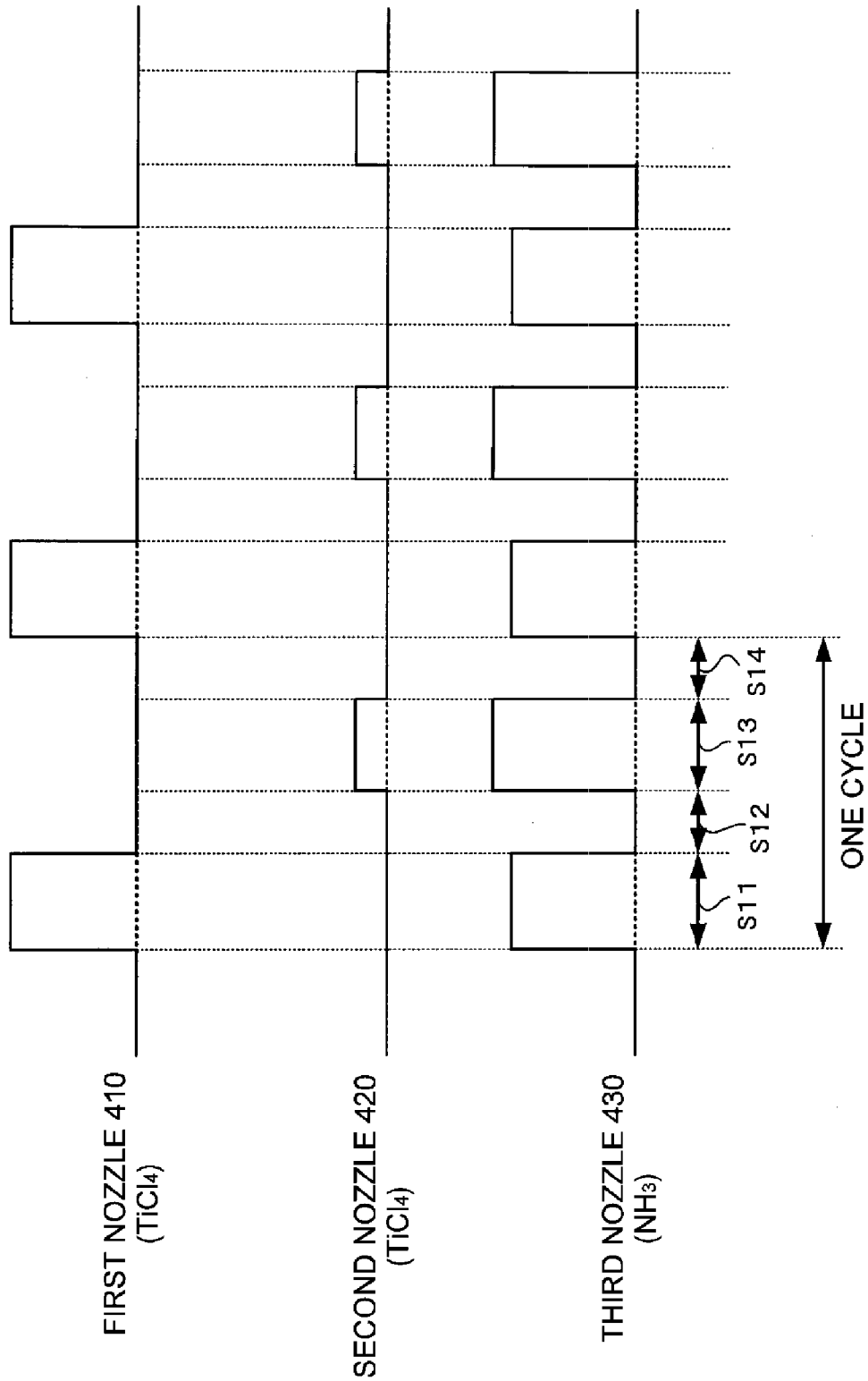
FIG. 5 is a diagram illustrating a film-forming sequence according to a first embodiment of the present invention.
Figure 6:
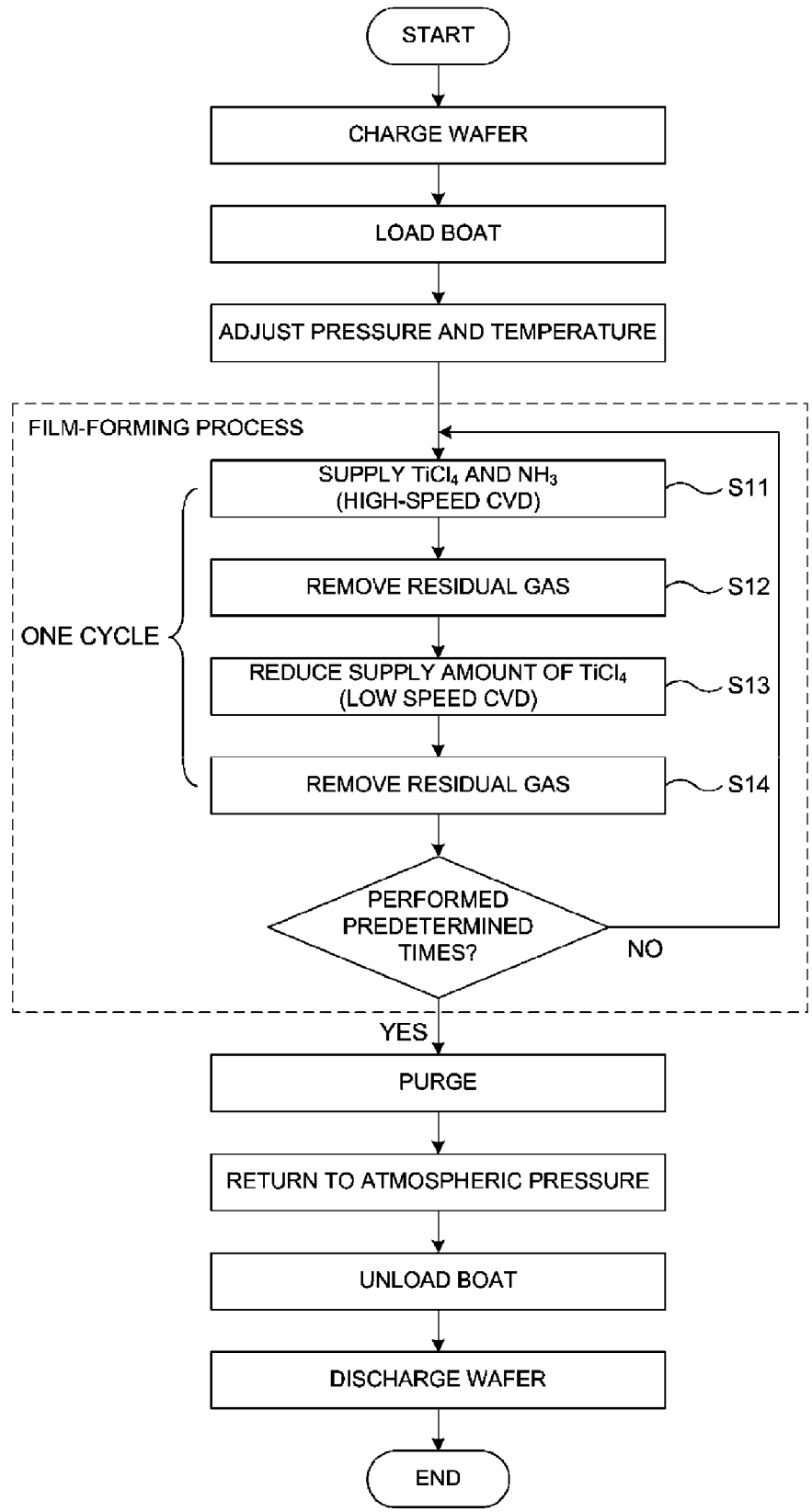
FIG. 6 is a flowchart illustrating a process in the first embodiment of the present invention.

FIG. 5 illustrates a film-forming sequence of a TiN film according to this embodiment. Also, FIG. 6 is a flowchart illustrating a process according to this embodiment. In a film-forming process, the controller 280 controls the substrate processing apparatus 1 as follows. That is, the controller 280 controls the heater 207 to maintain a temperature in the processing chamber 201 at a temperature in which a CVD reaction occurs, for example, within a range of 250° C. to 800° C., preferably at 700° C. or less, and more preferably at 450° C. Then, a plurality of wafers 200 are charged into the boat 217, and the boat 217 is loaded into the processing chamber 201. Subsequently, the boat 217 is rotated by the boat drive mechanism 267 to rotate the wafers 200. Then, the valve 243 is opened by an operation of the vacuum pump 246 to evacuate the inside of the processing chamber 201, and, when a temperature of the wafers 200 reaches 450° C. and the temperature is stabilized, a sequence to be described later is performed with the inner temperature of the processing chamber 201 maintained at 450° C.

The TiN film using the CVD method is formed by controlling, at the controller 280, valves, mass flow controllers and a vacuum pump to react $TiCl_4$ and $NH_3$ in a gaseous phase at a time point when the $TiCl_4$ and $NH_3$ are present in the processing chamber 201 at the same time and deposit the resultant reaction product on a surface of the wafer 200. Hereinafter, a specific film-forming sequence will now be described.

$TiCl_4$ is in a liquid state at room temperature, and methods of supplying $TiCl_4$ in a liquid state into the processing chamber 201 include a method of heating, vaporizing and supplying $TiCl_4$, and a method of passing an inert gas (referred to as a carrier gas) such as helium (He), neon (Ne), argon (Ar) or nitrogen ($N_2$) through a $TiCl_4$ container using the vaporizer 700 and supplying the carrier gas as much as the vaporized carrier gas into the processing chamber 201. However, the latter case will, for example, be described.

In this sequence, $TiCl_4$ and $NH_3$ are introduced at the same time. More particularly, $TiCl_4$ is introduced into the first gas supply tube 310 or the second gas supply tube 320, and the carrier gas ($N_2$) is introduced into the carrier gas supply tube 510 or the carrier gas supply tube 520. The valve 314 of the first gas supply tube 310 or the valve 324 of the second gas supply tube 320, the valve 514 of the carrier gas supply tube 510 or the valve 524 of the carrier gas supply tube 520, and the valve 243 of the exhaust pipe 231 are opened. The carrier gas flows through the carrier gas supply tube 510 or the carrier gas supply tube 520, and is then adjusted in flow rate by the mass flow controller 512 or the mass flow controller 522. $TiCl_4$ flows through the first gas supply tube 310, and is then adjusted in flow rate by the mass flow controller 312, vaporized by the vaporizer 700, mixed with the flow rate-adjusted carrier gas, and supplied through the first gas supply hole 410a of the first nozzle 410 into the processing chamber 201. $TiCl_4$ divided through the second gas supply tube 320 is supplied through the second gas supply hole 420a of the second nozzle 420 into the processing chamber 201.

Meanwhile, an opening area of the second gas supply hole 420a of the second nozzle 420 is set to be smaller than an opening area of the first gas supply hole 410a of the first nozzle 410. Since the opening area of the first gas supply hole 410a is greater than the opening area of the second gas supply hole 420a, $TiCl_4$ is supplied at a high flow rate through the first gas supply hole 410a of the first nozzle 410 into processing chamber 201 in step S11 that is the first film-forming process of forming the TiN film using the high-speed CVD method, and $TiCl_4$ is supplied at a low flow rate through the second gas supply hole 420a of the second nozzle 420 into the processing chamber 201 in step S13 that is the second film-forming process of forming the TiN film using the low-speed CVD method.

Also, $NH_3$ is introduced into the third gas supply tube 330, and a carrier gas ($N_2$) is introduced into the carrier gas supply tube 530. The valve 334 of the third gas supply tube 330, the valve 534 of the carrier gas supply tube 530 and the valve 243 of the exhaust pipe 231 are opened together. The carrier gas flows through the carrier gas supply tube 530, and is then adjusted in flow rate by the mass flow controller 532. $NH_3$ flows through the third gas supply tube 330, and is adjusted in flow rate by the mass flow controller 332. Then, $NH_3$ is mixed with the flow rate-adjusted carrier gas, and supplied through the third gas supply hole 430a of the third nozzle 430 into the processing chamber 201.

Then, $TiCl_4$ and $NH_3$ supplied into the processing chamber 201 are exhausted through the exhaust tube 231. In this case, the valve 243 is suitably adjusted to maintain an inner pressure of the processing chamber 201 within a range of 5 to 50 Pa, for example, 20 Pa. A supply amount of $TiCl_4$ controlled by the mass flow controller 312 is in a range of 0.8 to 3.0 g/min when the $TiCl_4$ is supplied through the first gas supply tube 310, and is in a range of 0.05 to 0.3 g/min when the $TiCl_4$ is supplied through the second gas supply tube 320. Also, a supply amount of $NH_3$ controlled by the mass flow controller 322 is in a range of 0.3 to 15 slm. A time taken to expose the wafer 200 to $TiCl_4$ and $NH_3$ is a time required until a film reaches a desired thickness. In this case, a temperature of the heater 207 is set so that a temperature of the wafer 200 can be in a range of 250° C. to 800° C., for example, 450° C. Meanwhile, when the temperature of the wafer 200 is, for example, less than 250° C., a reaction rate of $TiCl_4$ and $NH_3$ is lowered. Therefore, obtaining a film having a desired thickness within a predetermined time is difficult, and thus the practical industrial use of the film is also impossible. Accordingly, the temperature of the wafer 200 is preferably in a temperature range of 300° C. to 700° C. to sufficiently induce the CVD reaction at a high speed.

(Step S11)

In step S11, in order to form a TiN film on a substrate using a high-speed CVD method as the first film-forming process, $TiCl_4$ is supplied through the first nozzle 410, and $NH_3$ is supplied together with $TiCl_4$. $TiCl_4$ is introduced into the first gas supply tube 310, $NH_3$ is introduced into the third gas supply tube 330, and a carrier gas ($N_2$) is introduced into the carrier gas supply tubes 510 and 530. The valves 314 and 334 of the first and third gas supply tubes 310 and 330, the valves 514 and 534 of the carrier gas supply tubes 510 and 530, and the valve 243 of the exhaust pipe 231 are opened together and the valve 324 of the second gas supply tube 320 is closed. The carrier gas flows through the carrier gas supply tubes 510 and 530, and is then adjusted in flow rate by the mass flow controllers 512 and 532. $TiCl_4$ flows through the first gas supply tube 310, and is then adjusted in flow rate by the mass flow controller 312, vaporized by the vaporizer 700, mixed with the flow rate-adjusted carrier gas, and exhausted through the exhaust pipe 231 while being supplied through the first gas supply hole 410a of the first nozzle 410 into the processing chamber 201. $NH_3$ flows through the third gas supply tube 330, and is then adjusted in flow rate by the mass flow controller 332, mixed with the flow rate-adjusted carrier gas, and exhausted through the exhaust pipe 231 while being supplied through the third gas supply hole 430a of the third nozzle 430 into the processing chamber 201.

In this case, the valve 243 is suitably adjusted to maintain an inner pressure of the processing chamber 201 within a range of 20 to 50 Pa, for example, 30 Pa. A supply amount of $TiCl_4$ controlled by the mass flow controller 312 is, for example, in a range of 0.8 to 1.5 g/min. Also, a supply flow rate of $NH_3$ controlled by the mass flow controller 332 is, for example, in a range of 5.0 to 8.0 slm. A time taken to expose the wafer 200 to $TiCl_4$ and $NH_3$ is, for example, in a range of 5 to 30 seconds.

In this case, a gas flowing into the processing chamber 201 is an inert gas such as TiCl$_4$, NH$_3$ and N$_2$, and a gas phase reaction (thermal CVD reaction) occurs between TiCl$_4$ and NH$_3$ to deposit a TiN layer having a predetermined film thickness on a surface or underlying layer of the wafer 200. Here, in addition to the continuous layer made of TiN, the TiN layer includes discontinuous layers, thin films obtained by overlapping the discontinuous layers, or thin films to which other elements are added. Also, the continuous layer made of TiN is often referred to as a TiN thin film.

At the same time, when the valve 524 is opened to allow an inert gas to flow through the carrier gas supply tube 520 connected on the way to the second gas supply tube 320, introduction of a gas such as TiCl$_4$ or NH$_3$ into the second gas supply tube 320 may be prevented.

(Step S12)

In step S12, the valves 314 and 334 of the first gas supply tube 310 and the third gas supply tube 330 are closed to stop the supply of TiCl$_4$ and NH$_3$ into the processing chamber 201, and the valve 614 is opened to flow TiCl$_4$ through the vent line 610. As a result, TiCl$_4$ may be stably supplied into the processing chamber 201. In this case, the valve 243 of the gas exhaust pipe 231 is kept open to exhaust the inside of the processing chamber 201 using the vacuum pump 246 until an inner pressure of the processing chamber 201 reaches 20 Pa or less, and discharge the remaining TiCl$_4$ and NH$_3$ from the processing chamber 201. In this case, when an inert gas such as N$_2$ is supplied into the processing chamber 201, the remaining TiCl$_4$ and NH$_3$ may be discharged more effectively.

(Step S13)

In step S13, in order to form a TiN film on the substrate using the low-speed CVD method as the second film-forming process, TiCl$_4$ is supplied at a reduced supply amount compared to that of the TiCl$_4$ in step S11 using the second nozzle 420 having a smaller hole diameter than the first nozzle 410, compared to that of the TiCl$_4$ in step S11, and the mass flow controller 332 is simultaneously controlled to increase a supply amount of NH$_3$. That is, the valve 324 of the second gas supply tube 320 and the valve 334 of the third gas supply tube 330 are opened. TiCl$_4$ flows through the second gas supply tube 320, and is then mixed with the flow rate-adjusted carrier gas, and exhausted through the exhaust tube 231 while being supplied through the gas supply hole 420a of the second nozzle 420 into the processing chamber 201. The supply amount of TiCl$_4$ controlled by the mass flow controller 312 is in a range of 0.05 to 3.0 g/min.

In addition, the supply amount of NH$_3$ is controlled by the mass flow controller 332, and the supply amount of the NH$_3$ is, for example, set to 6.0 to 15 slm. A time taken to expose the wafer 200 to TiCl$_4$ and NH$_3$ is, for example, in a range of 15 to 120 seconds. The TiN film formed as described above has a lower residual Cl content than the TiN film formed by the high-speed CVD method, and is a continuous film that is made dense at low resistance. Also, as a sufficient excess of NH$_3$ with respect to a film-forming amount penetrates into the film, Cl present in the film formed by the high-speed CVD method may be reduced.

At the same time, when the switching valve 514 is kept open to allow an inert gas to flow through the carrier gas supply tube 510 connected on the way to the first gas supply tube 310, introduction of a gas such as TiCl$_4$ or NH$_3$ into the first gas supply tube 310 from the processing chamber 201 may be prevented.

(Step S14)

The valve 324 of the second gas supply tube 320 and the valve 334 of the third gas supply tube 330 are closed to stop the supply of TiCl$_4$ and NH$_3$ into the processing chamber 201, and the valve 614 is opened to flow TiCl$_4$ through the vent line 610. As a result, TiCl$_4$ may be stably supplied into the processing chamber 201. In this case, the valve 243 of the gas exhaust pipe 231 is kept open to exhaust the inside of the processing chamber 201 using the vacuum pump 246 until an inner pressure of the processing chamber 201 reaches 20 Pa or less, and discharge the remaining TiCl$_4$ and NH$_3$ from the processing chamber 201. In this case, when an inert gas such as N$_2$ is supplied into the processing chamber 201, the remaining TiCl$_4$ and NH$_3$ may be discharged more effectively.

A TiN film having a predetermined film thickness is formed on the wafer 200 using different kinds of CVD methods while removing a gas in the processing chamber 201 by performing steps S11 through S14 as one cycle once or a predetermined number of times.

According to this embodiment, by stopping introduction of a reaction gas into the processing chamber 201 at intervals of CVD film formation under the other conditions, a reaction product in the processing chamber 201 may be discharged out of the processing chamber 201 more effectively. Also, effects such as more effective discharging of the reaction product, reduction of residual Cl, and reduced production of byproducts can be expected. Also, as two kinds of CVD conditions are separately applied, a potential of forming an asymptotic TiN film whose film quality cannot be perfectly controlled during a change in flow rate may be lowered, which makes it effective to control the film quality.

Second Embodiment

Hereinafter, only parts different from those of the first embodiment will now be described in this embodiment.

Figure 7:
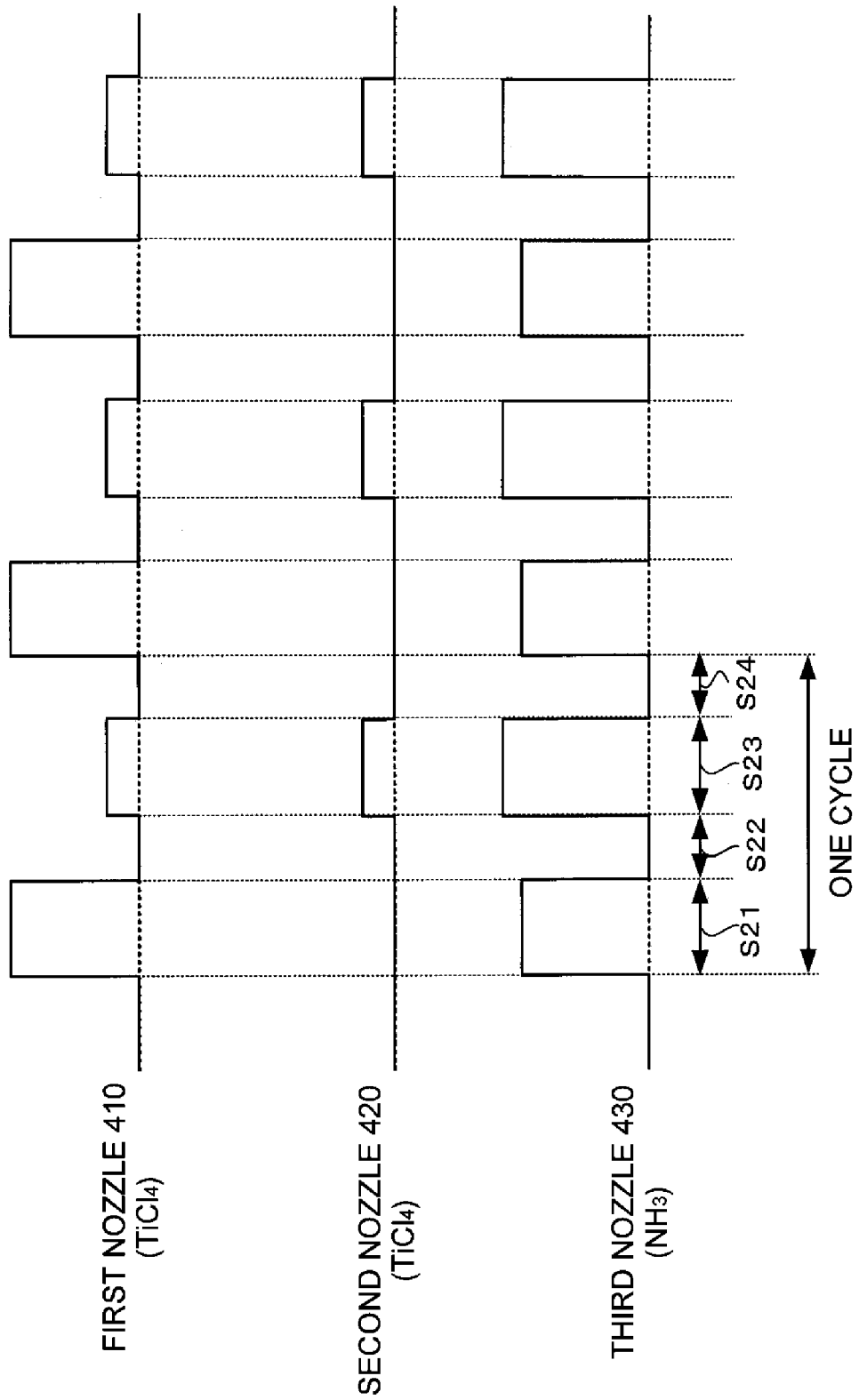
FIG. 7 is a diagram illustrating a film-forming sequence according to a second embodiment of the present invention.
Figure 8:
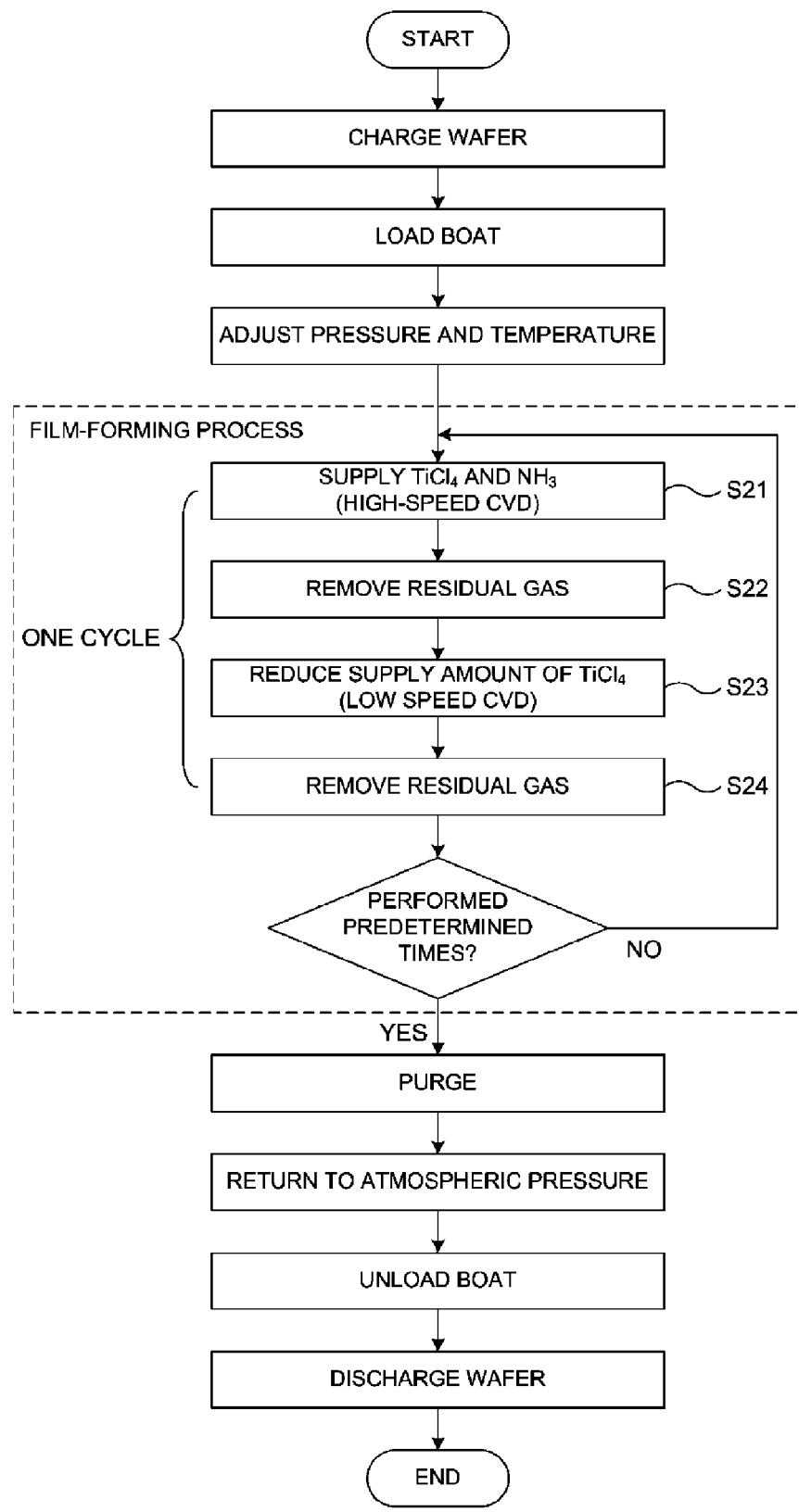
FIG. 8 is a flowchart illustrating a process in the second embodiment of the present invention.

In the first embodiment, the low-speed CVD method was used as the second film-forming process to reduce a supply amount of TiCl$_4$ using the second nozzle 420 having a smaller hole diameter than the first nozzle 410 without flowing TiCl$_4$ through the first nozzle 410 and simultaneously increase a supply amount of NH$_3$. However, in this embodiment, TiCl$_4$ flows through the first nozzle 410 in the second film-forming process. FIG. 7 depicts a sequence according to this embodiment. Also, FIG. 8 is a flowchart illustrating a process according to this embodiment. Hereinafter, the sequence according to this embodiment will be described with reference to FIGS. 7 and 8.

(Step S21)

In step S21, in order to form a TiN film on the substrate using the high-speed CVD method as the first film-forming process, TiCl$_4$ and NH$_3$ flow at the same time under the same conditions as in step S11.

(Step S22)

Similar to step S12, the valves 314 and 334 of the first gas supply tube 310 and the third gas supply tube 330 are closed to stop the supply of TiCl$_4$ and NH$_3$ into the processing chamber 201, and the valve 614 is opened to flow TiCl$_4$ through the vent line 610.

(Step S23)

In step S23, in order to form a TiN film on the substrate using the low-speed CVD method as the second film-forming process, a supply amount of TiCl$_4$ supplied through the first nozzle 410 is reduced, TiCl$_4$ is supplied through the second nozzle 420, and a supply amount of NH$_3$ is increased at the same time. In this case, the valve 314 is opened to allow TiCl$_4$ to flow into the first gas supply tube 310, and the valve 324 is simultaneously opened to allow TiCl$_4$ to flow into the second gas supply tube 320. TiCl$_4$ flows through the first gas supply tube 310 and the second gas supply tube 320, and is then adjusted in flow rate by the mass flow controller 312, mixed with the flow rate-adjusted carrier gas, and exhausted through the exhaust pipe 231 while being supplied through the first gas supply hole 410a of the first nozzle 410 and the second gas supply hole 420a of the second nozzle 420 into the processing chamber 201. The supply amount of $TiCl_4$ controlled by the mass flow controller 312 is referred to as a supply amount of $TiCl_4$ in which a low-speed CVD reaction occurs, and is, for example, in a range of 0.05 to 0.3 g/min.

In addition, the valve 334 is opened to allow $NH_3$ to flow into the third gas supply tube 330, a supply amount of $NH_3$ is controlled by the mass flow controller 332, and the supply amount of $NH_3$ is, for example, set to 6.0 to 15 slm. A time taken to expose the wafer 200 to $TiCl_4$ and $NH_3$ is, for example, in a range of 15 to 120 seconds. The TiN film formed as described above has a lower residual Cl content than the TiN film formed by the high-speed CVD method, and is a continuous film that is dense at low resistance. Also, as a sufficient excess of $NH_3$ with respect to a film-forming amount penetrates into the film, Cl present in the film formed by the high-speed CVD method may be reduced.

(Step S24)

The valves 314, 324 and 334 of the first gas supply tube 310, the second gas supply tube 320 and the third gas supply tube 330 are closed to stop the supply of $TiCl_4$ and $NH_3$ into the processing chamber 201, and the valve 614 is opened to flow $TiCl_4$ through the vent line 610. As a result, $TiCl_4$ may be stably supplied into the processing camber 201. In this case, the valve 243 of the gas exhaust pipe 231 is kept open to exhaust the inside of the processing chamber 201 using the vacuum pump 246 until an inner pressure of the processing chamber 201 reaches 20 Pa or less, and discharge the remaining $TiCl_4$ and $NH_3$ from the processing chamber 201. In this case, when an inert gas such as $N_2$ is supplied into the processing chamber 201, the remaining $TiCl_4$ and $NH_3$ may be discharged more effectively.

A TiN film having a predetermined film thickness is formed on the wafer 200 using many kinds of other CVD methods while removing a gas in the processing chamber 201 by performing steps S21 through S24 as one cycle once or a predetermined number of times.

Figure 9:
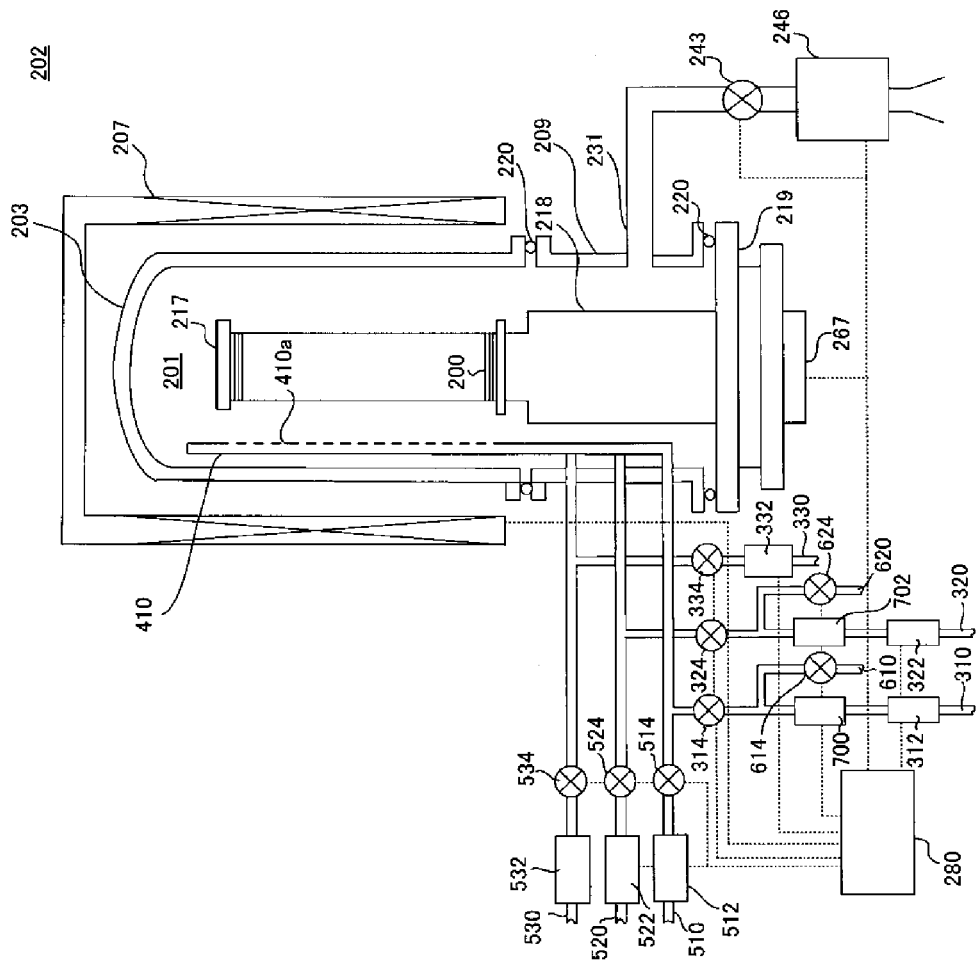
FIG. 9 is a configuration diagram schematically exemplifying a processing furnace and its accompanying members preferably used in another embodiment of the present invention, particularly a longitudinal cross-sectional view illustrating a part of the processing furnace.

Meanwhile, as shown in FIG. 2, the vaporization unit and the mass flow controller finally connected to the first nozzle 410 and the second nozzle 420 have a shape in which the vaporizer 700 and the mass flow controller 312 are commonly used. However, the vaporization unit and the mass flow controller may be independently provided, as shown in FIG. 9. That is, a mass flow controller 322, an vaporizer 702 and a valve 324 are installed in the second gas supply tube 320 in order from an upstream side, and the second gas supply tube 320 is connected to the carrier gas supply tube 520. Therefore, the second nozzle 420 may be connected to a front end of the second gas supply tube 320. In this case, similar to the first gas supply tube 310, a vent line 620 and a valve 624 connected to the exhaust tube 231 are also installed between the vaporizer 702 and the valve 324, and the first processing gas is supplied into the vent line 620 via the valve 624 when the first processing gas is not supplied into the processing chamber 201.

Figure 10:
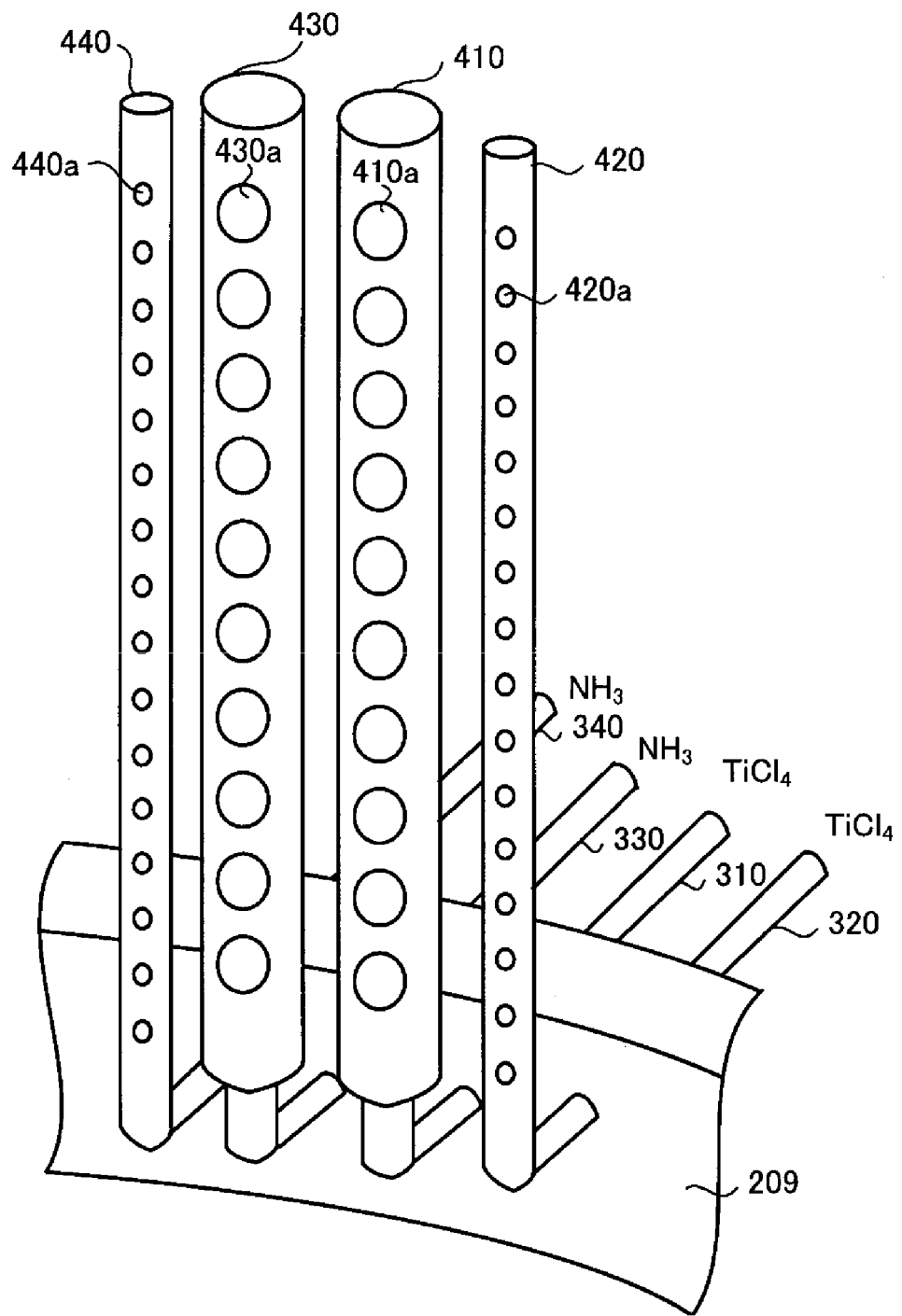
FIG. 10 is a configuration diagram schematically illustrating nozzles preferably used in another embodiment of the present invention.

According to the above-described embodiments, a case where two nozzles (the first nozzle 410 and the second nozzle 420) having different hole diameters and one nozzle (the third nozzle 430) are used to supply the first processing gas ($TiCl_4$) and the second processing gas ($NH_3$), respectively, has been described in detail, but the present invention is not limited thereto. As shown in FIG. 10, the present invention is, for example, applicable to a case where a fourth nozzle 440 including a fourth gas supply hole 440a having a different hole diameter from the third gas supply hole 430a of the third nozzle 430 for supplying the second processing gas ($NH_3$) is further provided, and two nozzles (the first nozzle 410 and the second nozzle 420) and two nozzles (the third nozzle 430 and the fourth nozzle 440) are used to supply the first processing gas ($TiCl_4$) and the second processing gas ($NH_3$), respectively. Therefore, both of the first processing gas ($TiCl_4$) and the second processing gas ($NH_3$) may be significantly changed in flow rate.

FIGS. 11a-11e are diagrams exemplifying variations of a method of supplying the first processing gas (TiCl4) into the first nozzle 410 and the second nozzle 420 that have different hole diameters.

Gas Supply Example 1

As shown in FIG. 11a, the first gas supply tube 310 for supplying the first processing gas ($TiCl_4$) is connected to the first nozzle 410 via a valve vt1, the mass flow controller 312, a valve vt2 and a valve v1, which are arranged in order from an upstream side. Also, the first gas supply tube 310 is connected to the second gas supply tube 320 via the valve vt1, the mass flow controller 312 and the valve vt2, which are arranged in order from an upstream side, and is then connected to the second nozzle 420 via a valve v2. In addition, the carrier gas ($N_2$) supply tube 510 (or 520) is connected to the first nozzle 410 via a valve vn1, the mass flow controller 512 or 522, a valve vn2 and the valve v1, which are arranged in order from an upstream side. Also, the carrier gas supply tube 510 (or 520) is branched from the valve vn1, the mass flow controller 512 (or 522) and the valve vn2, which are arranged in order from an upstream side, and is then connected to the second gas supply tube 320 and connected to the second nozzle 420 via the valve v2. That is, the valves vt1, vt2, vn1, vn2, v1 the v2, and the mass flow controllers 312 and 512 (or 522) are controlled to supply at least one of $TiCl_4$ and $N_2$ from at least one of the first gas supply hole 410a of the first nozzle 410 and the second gas supply hole 420a of the second nozzle 420 into the processing chamber 201 and stop the supply of the at least one of $TiCl_4$ and $N_2$ into the processing chamber 201.

Gas Supply Example 2

As shown in FIG. 11b, the first gas supply tube 310 is connected to the first nozzle 410 via the valve vt1, the mass flow controller 312, the valve vt2 and the valve v1, which are arranged in order from an upstream side. Also, the first gas supply tube 310 is branched from the valve vt1, the mass flow controller 312 and the valve vt2, which are arranged in order from an upstream side, and is then connected to the second gas supply tube 320 and the second nozzle 420. In addition, the carrier gas ($N_2$) supply tube 510 (or 520) is connected to the first nozzle 410 via the valve vn1, the mass flow controller 512 (or 522), the valve vn2 and the valve v1, which are arranged in order from an upstream side. Also, the carrier gas supply tube 510 (or 520) is branched from the valve vn1, the mass flow controller 512 (or 522) and the valve vn2, which are arranged in order from an upstream side, and is then connected to the second gas supply tube 320 and the second nozzle 420. That is, the valves vt1, vt2, vn1, vn2 and v1, and the mass flow controllers 312 and 512 (or 522) are controlled to supply at least one of $TiCl_4$ and $N_2$ from at least one of the first gas supply hole 410a of the first nozzle 410 and the second gas supply hole 420a of the second nozzle 420 into the processing chamber 201 and stop the supply of the at least one of TiCl$_4$ and N$_2$ into the processing chamber 201.

Gas Supply Example 3

As shown in FIG. 11c, the first gas supply tube 310 is connected to the first nozzle 410 via the valve vt1, the mass flow controller 312, the valve vt2, the mass flow controller 600 and the valve v1, which are arranged in order from an upstream side. In addition, the first gas supply tube 310 is branched from the valve vt1, the mass flow controller 312 and the valve vt2, which are arranged in order from an upstream side, and is then connected to the second gas supply tube 320 and the second nozzle 420. Also, the carrier gas (N$_2$) supply tube 510 (or 520) is connected to the first nozzle 410 via the valve vn1, the mass flow controller 512 (or 522), the valve vn2, the mass flow controller 600 and the valve v1, which are arranged in order from an upstream side. In addition, the carrier gas supply tube 510 (or 520) is branched from the valve vn1, the mass flow controller 512 (or 522) and the valve vn2, which are arranged in order from an upstream side, and is then connected to the second gas supply tube 320 and the second nozzle 420. That is, the valves vt1, vt2, vn1, vn2 and v1, and the mass flow controllers 312, 512 (or 522) and 600 are controlled to supply at least one of TiCl$_4$ and N$_2$ from at least one of the first gas supply hole 410a of the first nozzle 410 and the second gas supply hole 420a of the second nozzle 420 into the processing chamber 201 and stop the supply of the at least one of TiCl$_4$ and N$_2$ into the processing chamber 201.

Gas Supply Example 4

As shown in FIG. 11d, the first gas supply tube 310 is connected to the first nozzle 410 via the valve vt1, a mass flow controller 312a, the valve vt2 and the valve v1, which are arranged in order from an upstream side. Also, the first gas supply tube 310 is branched from an upstream side of the valve vt1, and is then connected to the second gas supply tube 320 via a valve vt3, a mass flow controller 312b and a valve vt4 and connected to the second nozzle 420 via the valve v2. In addition, the carrier gas (N$_2$) supply tube 510 (or 520) is connected to the first nozzle 410 via the valve vn1, a mass flow controller 512a (or 522a), the valve vn2 and the valve v1, which are arranged in order from an upstream side. Also, the carrier gas supply tube 510 (or 520) is branched from an upstream side of the valve vn1, and is then connected to the second gas supply tube 320 via a valve vn3, a mass flow controller 512b (or 522b) and a valve vn4 and connected to the second nozzle 420 via the valve v2. That is, the valves vt1, vt2, vt3, vt4, vn1, vn2, vn3, vn4, v1 and v2, and the mass flow controllers 312a, 312b, 512a (or 522a) and 512b (or 522b) are controlled to supply at least one of TiCl$_4$ and N$_2$ from at least one of the first gas supply hole 410a of the first nozzle 410 and the second gas supply hole 420a of the second nozzle 420 into the processing chamber 201 and stop the supply of the at least one of TiCl$_4$ and N$_2$ into the processing chamber 201.

Gas Supply Example 5

As shown in FIG. 11e, the first gas supply tube 310 is connected to the first nozzle 410 via the valve vt1, the mass flow controller 312a and the valve vt2, which are arranged in order from an upstream side. Also, the first gas supply tube 310 is branched from an upstream side of the valve vt1 and is then connected to the second gas supply tube 320 via the valve vt3, the mass flow controller 312b and the valve vt4, and the second gas supply tube 320 is connected to the second nozzle 420. Also, the carrier gas (N$_2$) supply tube 510 (or 520) is connected to the first nozzle 410 via the valve vn1, a mass flow controller 512a (or 522a) and the valve vn2, which are arranged in order from an upstream side. Also, the carrier gas supply tube 510 (or 520) is branched from an upstream side of the valve vn1 and is then connected to the second gas supply tube 320 via the valve vn3, the mass flow controller 512b (or 522b) and the valve vn4, and the second gas supply tube 320 is connected to the second nozzle 420. That is, the valves vt1, vt2, vt3, vt4, vn1, vn2, vn3 and vn4, and the mass flow controllers 312a, 312b, 512a (or 522a) and 512b (or 522b) are controlled to supply at least one of TiCl$_4$ and N$_2$ from at least one of the first gas supply hole 410a of the first nozzle 410 and the second gas supply hole 420a of the second nozzle 420 into the processing chamber 201 and stop the supply of the at least one of TiCl$_4$ and N$_2$ into the processing chamber 201.

As described above, the method of supplying the first processing gas (TiCl$_4$) into the first nozzle 410 and the second nozzle 420 that have different hole diameters will be, for example, described in detail, but these gas supply examples are applicable to a method of supplying the second processing gas (NH$_3$).

Meanwhile, in this embodiment, a case where gases are supplied at different flow rates through two nozzles has been described in detail, but the supply of the gases at different flow rates may be performed using one nozzle by adjusting a hole diameter or a pressure.

Also, when a gas is supplied at a high flow rate (high-speed CVD), the gas may be supplied through both of the two nozzles. In addition, when the gas is supplied at a low flow rate (low-speed CVD), the gas may be supplied through only a nozzle including a gas supply hole having a relatively smaller hole diameter. Therefore, even when the gas is supplied at a low flow rate, the supply of the gas from only an upstream side can be prevented as long as the gas is weakly supplied, and thus the gas may be uniformly supplied.

When the present invention is applied to a single-type apparatus, a multiple-stage shower plate may be used to control a flow rate at a mass flow controller. In this case, the flow rate may be easily controlled and the gas may be uniformly supplied due to the presence of a face plate even when the flow rate is changed.

By repeatedly forming a TiN film using the high-speed CVD method and a film using the low-speed CVD method, a high-quality film may be formed at a high throughput, compared to the TiN film formed by the ALD method.

In addition, as the TiN film formed by the low-speed CVD method is formed on the TiN film formed by the high-speed CVD method, an underlying film formed by the high-speed CVD method may be modified to form a more dense continuous film.

Also, according to the present invention, the film quality such as reductions in resistance of the TiN film and concentration of Cl may be improved while maintaining high productivity.

Also, although the vertical apparatus has been generally illustrated as described above, the present invention is not limited to the vertical apparatus, but the present invention is also applicable to other apparatuses such as a single-type apparatus so as to form a TiN film using at least two kinds of other CVD methods. Also, although the vertical thermal CVD apparatus has been generally illustrated as described above, the present invention is not limited to the vertical thermal CVD apparatus, but the present invention is also applicable to other apparatuses such as a plasma CVD apparatus and an optical CVD apparatus so as to form a TiN film using at least two kinds of other CVD methods.

Also, although the TiN film has been generally described, the present invention is not limited thereto, but the present invention is applicable to many kinds of other films. Also, the present invention is applicable to a conductive film (Ti, TiN, TiAlN, TiSiN, Ta, TaN, TaSiN, Al, Cu, Mn, MnO, Ru, W, GeSb, GeSbTe, ZnO, ZnAlO, etc.) or an insulating film (HfO, HfON, HfSiO, HfSiON, HfAlO, HfAlON, ZrO, AlO, MN, etc.) formed on a substrate (a wafer) using a halogenated metal compound or an organometallic compound as a source. In addition to the above-described components, the present invention is applicable to a Si-based film formed on the substrate using a Si-based halide (DCS, HCD, etc.) or a Si-based organic material (TEOS, TDMAT, etc.).

Furthermore, when a source includes at least one of Ti, Al, Si, Ta, copper (Cu), Mn, ruthenium (Ru), W, germanium (Ge), antimony (Sb), tellurium (Te), Hf and Zr, the source may be used herein. Also, a source for modifying a film formed on the substrate and including some portion of the halogenated metal compound or the organometallic compound is not limited to $NH_3$. Therefore, when the source is an O-containing source or a N-containing source, it may be used herein. For example, any one of $N_2$, $N_2O$, $CH_6N_2$, $O_2$, $O_3$, $H_2O$, $H_2O_2$, $O_2$ and $H_2$ may be used as the source.

Preferred Aspects of the Present Invention

Hereinafter, preferred aspects of the present invention will now be additionally stated.

(Supplementary Note 1)
According to one aspect of the present invention, there is provided a thin film-forming apparatus for forming a thin film on a substrate to be processed through reaction of at least two kinds of gases, characterized in that the thin film is formed in a series of film-forming sequences using at least two kinds of pulses having different shapes by supplying at least one of the gases supplied for the reaction into a processing chamber in a pulse shape.

(Supplementary Note 2)
Preferably, the thin film-forming apparatus is a batch processing apparatus in which at least five substrates are processed at a time.

(Supplementary Note 3)
Preferably, two types of gas introduction units configured to supply at least one kind of gas into the processing chamber are provided.

(Supplementary Note 4)
Preferably, introduction time points and introduction amounts of gases supplied respectively to the two types of gas supply units configured to supply the at least one kind of gas into the processing chamber are separately controlled.

(Supplementary Note 5)
Preferably, each of the gas supply units configured to supply the at least one kind of gas into the processing chamber includes at least two nozzles.

(Supplementary Note 6)
Preferably, the nozzles are multi-hole nozzles having different hole diameters.

(Supplementary Note 7)
Preferably, the formed thin film is a metal compound.

(Supplementary Note 8)
Preferably, the formed thin film is a TiN film.

(Supplementary Note 9)
Preferably, the reaction gas supplied for film formation includes $TiCl_4$ and $NH_3$.

(Supplementary Note 10)
Preferably, the gas supplied in the series of film-forming sequences using the at least two different kinds of pulses is $TiCl_4$.

(Supplementary Note 11)
According to another aspect of the present invention, there is provided a substrate processing apparatus comprising: a processing chamber configured to stack and accommodate a plurality of substrates; a first processing gas supply system configured to supply a first processing gas into the processing chamber; a second processing gas supply system configured to supply a second processing gas into the processing chamber; and a control unit configured to control the first processing gas supply system and the second processing gas supply system, wherein at least one of the first processing gas supply system and the second processing gas supply system includes two nozzles having different shapes, the two nozzles being vertically arranged along a stacking direction of the substrates, and when the first processing gas and the second processing gas are supplied into the processing chamber at pulses having different film-forming rates to form a film on the substrates, the control unit controls the first processing gas supply system and the second processing gas supply system to supply at least one of the first processing gas and the second processing gas into the processing chamber through the two nozzles having the different shapes.

(Supplementary Note 12)
Preferably, for Supplementary Note 11, the two nozzles having the different shapes include a first nozzle having a plurality of first gas supply holes having a first hole diameter and a second nozzle having a plurality of second gas supply holes having a hole diameter different from the first hole diameter.

(Supplementary Note 13)
Preferably, for Supplementary Note 12, a supply amount of the second processing gas supplied through the second nozzle is less than that of the first processing gas supplied through the first nozzle.

(Supplementary Note 14)
Preferably, for Supplementary Note 13, an opening area of each of the second gas supply holes is smaller than that of each of the first gas supply holes.

(Supplementary Note 15)
Preferably, for Supplementary Note 14, the first processing gas is supplied through both the first nozzle and the second nozzle when the first processing gas is supplied at a high flow rate into the processing chamber, and the first processing gas is supplied through only the second nozzle when the first processing gas is supplied at a low flow rate into the processing chamber.

(Supplementary Note 16)
Preferably, for Supplementary Note 11, the gas supplied through the two nozzles having different shapes is a gas containing an element which constitutes a film to be formed and is naturally in a solid state (Supplementary Note 17)
According to still another aspect of the present invention, there is provided a substrate processing apparatus including a processing chamber configured to stack and accommodate a plurality of substrates, a first processing gas supply system configured to supply a first processing gas into the processing chamber, a second processing gas supply system configured to supply a second processing gas into the processing chamber, a control unit configured to control the first processing gas supply system and the second processing gas supply system, wherein the first processing gas supply system and the second processing gas supply system include two nozzles which are vertically arranged in a stacking direction of the substrates and have different shapes, respectively, and the control unit is configured to supply the first processing gas and the second processing gas through the two nozzles having different shapes, respectively, when films are formed on the substrates by supplying the first processing gas and the second processing gas into the processing chamber at pulses having different film-forming rates.

(Supplementary Note 18)

Preferably, there is provided a semiconductor device manufactured using the substrate processing apparatus described in any one of Supplementary Notes 11 through 17.

(Supplementary Note 19)

According to yet another aspect of the present invention, there is provided a method of manufacturing a semiconductor device, including the steps of: (a) supplying a first processing gas into a processing chamber, in which a substrate is accommodated, through a first nozzle and simultaneously supplying a second processing gas into the processing chamber through a second nozzle; (b) exhausting the processing chamber; (c) supplying the first processing gas into the processing chamber through a third nozzle having a different shape from the first nozzle and simultaneously supplying the second processing gas into the processing chamber through the second nozzle; and (d) exhausting the processing chamber, wherein steps (a) through (d) are sequentially performed once or more to form a desired film on the substrate.

(Supplementary Note 20)

Preferably, there is provided a semiconductor device manufactured using the method of manufacturing a semiconductor device described in Supplementary Notes 19.

What is claimed is:

1. A substrate processing apparatus comprising:
a reaction tube configured to stack and accommodate a plurality of substrates;
a first processing gas supply system configured to supply a first processing gas into the reaction tube;
a second processing gas supply system configured to supply a second processing gas into the reaction tube; and
a control unit configured to control the first processing gas supply system and the second processing gas supply system,
wherein at least one of the first processing gas supply system and the second processing gas supply system includes two nozzles having different shapes, the two nozzles being disposed inside the reaction tube and vertically arranged along a stacking direction of the substrates, and
wherein the control unit is configured to control the first processing gas supply system, when the first processing gas and the second processing gas are supplied into the reaction tube at pulses having different film-forming rates to form a film on the substrates, to supply the first processing gas through a first nozzle of the two nozzles at a first flow rate after supplying the first processing gas through a second nozzle of the two nozzles at a second flow rate.

2. The substrate processing apparatus according to claim 1, wherein the first nozzle includes a plurality of first gas supply holes having a first hole diameter and the second nozzle includes a plurality of second gas supply holes having a hole diameter different from the first hole diameter.

3. The substrate processing apparatus according to claim 2, wherein an opening area of each of the second gas supply holes is smaller than that of each of the first gas supply holes.

4. The substrate processing apparatus according to claim 1, wherein at least one of the first processing gas and the second processing gas supplied through the two nozzles includes a chemical element constituting the film and being naturally in a solid state.

5. The substrate processing apparatus according to claim 1, wherein each of the two nozzles is connected to a gas supply pipe provided with a mass flow controller.

6. The substrate processing apparatus according to claim 1, wherein the control unit is configured to control the second processing gas supply system to supply the second processing gas at a third flow rate while the first processing gas is supplied into the reaction tube at the first flow rate, and supply the second processing gas at a fourth flow rate greater than the third flow rate while the first processing gas is supplied into the reaction tube at the second flow rate.

7. A substrate processing apparatus comprising:
a reaction tube configured to stack and accommodate a plurality of substrates;
a first processing gas supply system configured to supply a first processing gas into the reaction tube;
a second processing gas supply system configured to supply a second processing gas into the reaction tube; and
a control unit configured to control the first processing gas supply system and the second processing gas supply system,
wherein at least one of the first processing gas supply system and the second processing gas supply system includes two nozzles having different shapes, the two nozzles being disposed inside the reaction tube and vertically arranged along a stacking direction of the substrates, and
wherein the control unit is configured to control the first processing gas supply system and the second processing gas supply system, when the first processing gas and the second processing gas are supplied into the reaction tube at pulses having different film-forming rates to form a film on the substrates, to supply the first processing gas through both a first nozzle and a second nozzle of the two nozzles when the first processing gas is supplied at a high flow rate into the reaction tube, and to supply the first processing gas through only the second nozzle when the first processing gas is supplied at a low flow rate into the reaction tube.

8. A substrate processing apparatus comprising:
a reaction tube configured to stack and accommodate a plurality of substrates;
a first processing gas supply system configured to supply a first processing gas into the reaction tube;
a second processing gas supply system configured to supply a second processing gas into the reaction tube; and
a control unit configured to control the first processing gas supply system and the second processing gas supply system,
wherein the first processing gas supply system includes a first nozzle and a second nozzle having a shape different from that of the first nozzle, the first nozzle and the second nozzle being disposed in a stacking direction of the substrates in the reaction tube, and
wherein the control unit is configured to control the first processing gas supply system to supply the first processing gas through the second nozzle at a second flow rate after supplying the first processing gas through the first nozzle at a first flow rate greater than the second flow rate.

* * * * *